(12) United States Patent
Fukami et al.

(10) Patent No.: US 10,410,703 B2
(45) Date of Patent: Sep. 10, 2019

(54) MAGNETORESISTANCE EFFECT ELEMENT AND MAGNETIC MEMORY DEVICE

(71) Applicant: TOHOKU UNIVERSITY, Sendai-shi, Miyagi (JP)

(72) Inventors: Shunsuke Fukami, Sendai (JP); Toru Iwabuchi, Sendai (JP); Hideo Ohno, Sendai (JP); Tetsuo Endoh, Sendai (JP)

(73) Assignee: TOHOKU UNIVERSITY, Sendai-shi, Miyagi (JP)

( * ) Notice: Subject to any disclaimer, the term of this patent is extended or adjusted under 35 U.S.C. 154(b) by 0 days.

(21) Appl. No.: 15/810,896

(22) Filed: Nov. 13, 2017

(65) Prior Publication Data

US 2018/0108390 A1   Apr. 19, 2018

Related U.S. Application Data

(63) Continuation of application No. PCT/JP2016/064530, filed on May 16, 2016.

(30) Foreign Application Priority Data

May 14, 2015   (JP) ................................. 2015-098976

(51) Int. Cl.
*G11C 11/00* (2006.01)
*G11C 11/02* (2006.01)
(Continued)

(52) U.S. Cl.
CPC ............ *G11C 11/02* (2013.01); *G01R 33/093* (2013.01); *G01R 33/098* (2013.01); *G11C 7/10* (2013.01);
(Continued)

(58) Field of Classification Search
CPC ...................................................... G11C 11/02
(Continued)

(56) References Cited

U.S. PATENT DOCUMENTS

2007/0242505 A1   10/2007 Ochiai et al.
2010/0149863 A1   6/2010 Lee et al.
(Continued)

FOREIGN PATENT DOCUMENTS

JP   2005-191032 A   7/2005
JP   2007-273495 A   10/2007
(Continued)

*Primary Examiner* — Hoai V Ho
(74) *Attorney, Agent, or Firm* — Rabin & Berdo, P.C.

(57) ABSTRACT

A magnetoresistance effect element includes a recording layer containing a ferromagnetic body, and including a first fixed and second magnetization regions having magnetization components fixed substantially in a direction antiparallel to the in-plane direction to each other, and a free magnetization region disposed between the first and second fixed magnetization regions and having a magnetization component invertible in the in-plane direction, a domain wall disposed between the first fixed magnetization region and the free magnetization region, and being movable within the free magnetization region, and a magnetic nanowire having a width of 40 nm or less. The thickness of the recording layer is 40 nm or less and at least half but no more than twofold the width of the magnetic nanowire. The element further includes a barrier layer disposed on the recording layer, and a reference layer disposed on the barrier layer and containing a ferromagnetic body.

8 Claims, 24 Drawing Sheets

(51) Int. Cl.
*H01L 43/08* (2006.01)
*G01R 33/09* (2006.01)
*G11C 7/10* (2006.01)
*G11C 11/16* (2006.01)
*H01F 1/00* (2006.01)
*H01F 10/32* (2006.01)
*B82Y 10/00* (2011.01)
*B82Y 25/00* (2011.01)

(52) U.S. Cl.
CPC ........ *G11C 11/161* (2013.01); *G11C 11/1659* (2013.01); *G11C 11/1673* (2013.01); *G11C 11/1675* (2013.01); *H01F 1/0072* (2013.01); *H01F 10/3254* (2013.01); *H01L 43/08* (2013.01); *B82Y 10/00* (2013.01); *B82Y 25/00* (2013.01)

(58) Field of Classification Search
USPC ......................................................... 365/158
See application file for complete search history.

(56) References Cited

U.S. PATENT DOCUMENTS

| | | | |
|---|---|---|---|
| 2010/0193889 A1* | 8/2010 | Nagahara | B82Y 10/00 257/421 |
| 2011/0298067 A1 | 12/2011 | Ishiwata et al. | |
| 2013/0141966 A1 | 6/2013 | Ohno et al. | |
| 2015/0371696 A1* | 12/2015 | Lew | G11C 11/16 365/33 |

FOREIGN PATENT DOCUMENTS

| | | |
|---|---|---|
| JP | 2008-147488 A | 6/2008 |
| JP | 2010-080496 A | 4/2010 |
| JP | 2010-141340 A | 6/2010 |
| JP | 2012-028489 A | 2/2012 |
| WO | WO-2009/001706 A1 | 12/2008 |
| WO | WO-2009/133744 A1 | 11/2009 |
| WO | WO-2010/095589 A1 | 8/2010 |
| WO | WO-2011/152281 A1 | 12/2011 |

* cited by examiner

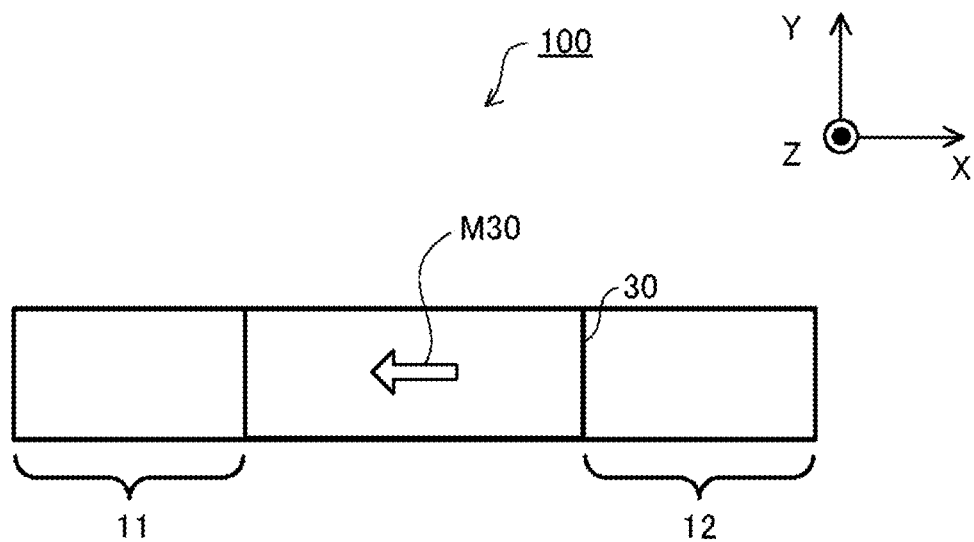

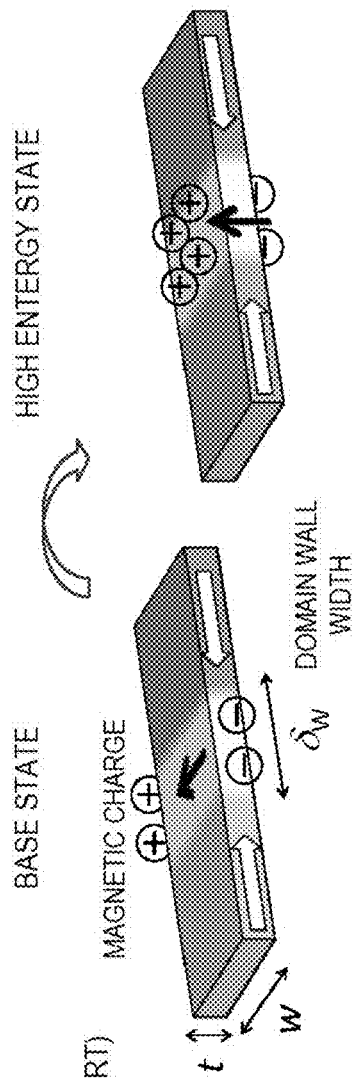
FIG. 7A IN-PLANE (RELATED ART) — BASE STATE / MAGNETIC CHARGE / DOMAIN WALL WIDTH $\delta_W$
FIG. 7B — HIGH ENTERGY STATE
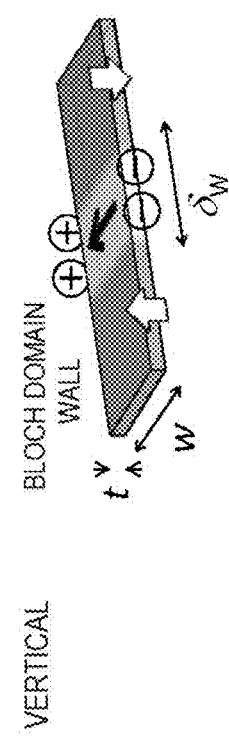
FIG. 7C VERTICAL — BLOCH DOMAIN WALL
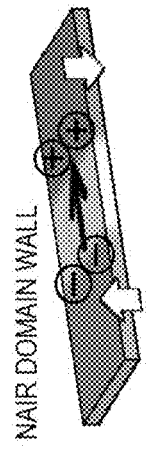
FIG. 7D — NAIR DOMAIN WALL
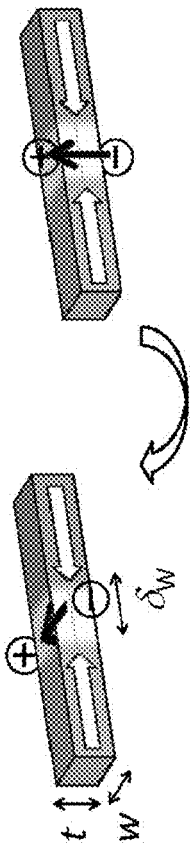
FIG. 7E IN-PLANE (EMBODIMENT)
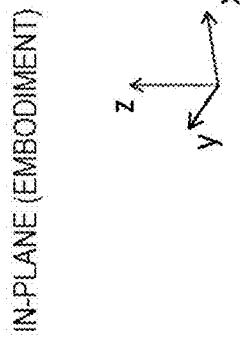
FIG. 7F

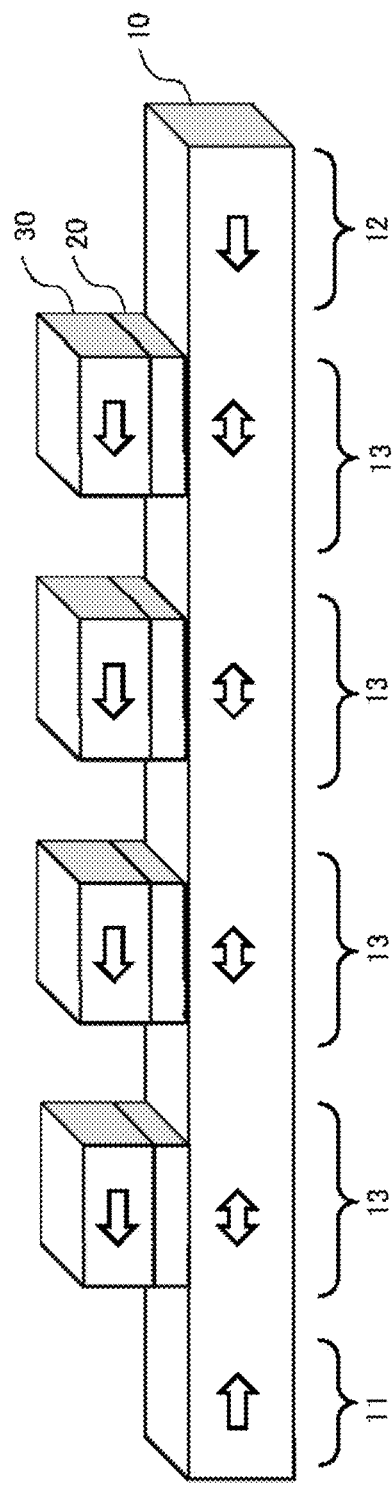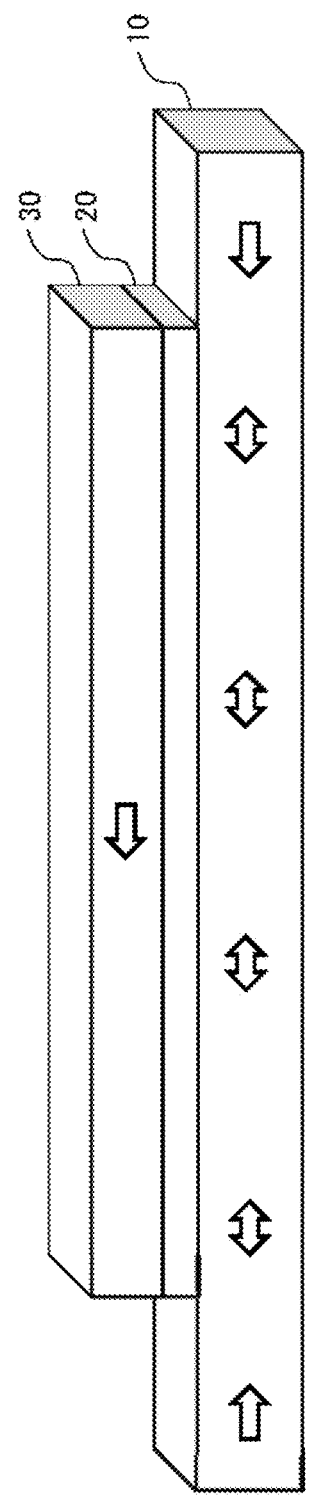

MAGNETORESISTANCE EFFECT ELEMENT AND MAGNETIC MEMORY DEVICE

BACKGROUND OF THE INVENTION

Technical Field

The present invention relates to a magnetoresistance effect element and magnetic memory device.

Background Arts

STT-MRAM (spin-transfer torque magnetic random access memory) using an MTJ (magnetic tunneling junction) element is drawing attention as the next generation non-volatile memory with high-speed and high-rewriting resistance capabilities. When data is written in the STT-MRAM, the resistance state of the MTJ element is changed to a high resistance state or low resistance state using spin transfer torque (STT), and stored data is read out by detecting the resistance state of the MTJ element.

The data writing methods of STT-MRAM include the spin injection magnetization inversion method, and the current induced magnetization method. In the spin injection magnetization inversion method, an electric current is introduced to a magnetoresistance effect element, and by using the torque generated by spin polarized electrons to magnetize a recording layer, the resistance state of the magnetoresistance effect element is changed. In the current induced magnetization method, a domain wall generated in the magnetic layer by the electric current is moved, thereby changing the resistance state of the magnetoresistance effect element.

As for the current induced magnetization method, Japanese Patent Application Laid-open Publication No. 2005-191032 discloses an element in which a domain wall is introduced in a magnetic layer having the in-plane magnetization. Also, WO2009/001706 discloses the technique of introducing the domain wall in the magnetic layer having the vertical magnetization and writing data by moving the domain wall.

SUMMARY OF THE INVENTION

When a magnetic layer having in-plane magnetization is used as described in Japanese Patent Application Laid-open Publication No. 2005-191032, the current density required for data writing (threshold current density) increases, and due to the breakage or shrinkage of metal wiring caused by Joule heat generation, it is difficult to ensure the stable operation of the element.

The invention of WO2009/001706 was made to solve the problem of increased threshold current density described above. However, even if the magnetic layer using the vertical magnetization is employed, if the width of the magnetic nanowire is small, the threshold current density would still go up. Specifically, when the width of the magnetic nanowire of the magnetic layer is approximately 20 nm or smaller, the threshold current density would exceed $10^{12}$ A/m². This results in a failure of the element such as breakage or shrinkage of the metal wiring.

The present invention was made in view of the problem described above, and an object thereof is to provide a magnetoresistance effect element and a magnetic memory device that can drive a domain wall with a low current density when the width of magnetic nanowire is small.

According to an aspect of the invention, there is provided a magnetoresistance effect element, including a recording layer containing a ferromagnetic body, the recording layer including a first fixed magnetization region having a magnetization component fixed substantially in an in-plane direction, a second fixed magnetization region having a magnetization component fixed substantially in a direction antiparallel to the in-plane direction of the magnetization component of the first fixed magnetization region, a free magnetization region disposed between the first fixed magnetization region and the second fixed magnetization region, the free magnetization region having a magnetization component that is invertible in the in-plane direction, a domain wall disposed between the first fixed magnetization region and the free magnetization region, and being movable within the free magnetization region, and a magnetic nanowire having a width of 40 nm or less. The recording layer has a thickness of 40 nm or less, the thickness of the recording layer being at least half but no more than twofold the width of the magnetic nanowire. The magnetoresistance effect element further includes a barrier layer disposed on the recording layer and a reference layer disposed on the barrier layer and containing a ferromagnetic body.

According to another aspect of the invention, there is provided a magnetoresistance effect element, including a recording layer containing a ferromagnetic body, the recording layer including a first fixed magnetization region having a magnetization component fixed substantially in an in-plane direction, a second fixed magnetization region having a magnetization component fixed substantially in a direction antiparallel to the in-plane direction of the magnetization component of the first fixed magnetization region, a free magnetization region disposed between the first fixed magnetization region and the second fixed magnetization region, the free magnetization region having a magnetization component that is invertible in the in-plane direction, a domain wall disposed between the first fixed magnetization region and the free magnetization region, and being movable within the free magnetization region and having a transverse domain wall structure.

According to an aspect of the invention, there is provided a magnetic memory device, includes the above magnetoresistance effect element, a writing unit configured to write data into the magnetoresistance effect element by applying a writing current between the first fixed magnetization region and the second fixed magnetization region through the free magnetization region in the recording layer, to thereby move the domain wall, and a reading unit configured to read out data from the magnetoresistance effect element by applying a current through the barrier layer in a direction parallel to a thickness direction of the magnetoresistance element that is effective to obtain a tunnel resistance.

According to the present invention, it is possible to drive a domain wall with a low current density when the width of magnetic nanowire is small, and as a result, highly-integrated and high-performance magnetoresistance effect element and magnetic memory device can be provided.

BRIEF DESCRIPTION OF THE DRAWINGS

FIGS. 1A to 1C are diagrams showing the structure of a magnetoresistance effect element of Embodiment 1 of the present invention. FIG. 1A is a front view, FIG. 1B is a side view, and FIG. 1C is a plan view (top view).

FIG. 3A is a diagram showing the magnetoresistance effect element before writing, FIG. 3B is a waveform diagram of the writing current, and FIG. 3C is a diagram showing the magnetoresistance effect element after writing.

FIG. 4A is a diagram showing the magnetoresistance effect element before writing, FIG. 4B is a waveform diagram of the writing current, and FIG. 4C is a diagram showing the magnetoresistance effect element after writing.

FIGS. 7A to 7F are diagrams for explaining the hard axis anisotropic magnetic field. FIGS. 7A and 7B show the magnetization state of the domain wall in the base state and the high energy state, respectively, in the conventional in-plane magnetization method. FIGS. 7C and 7D show the magnetization state of the domain wall in the base state and the high energy state, respectively, in the vertical magnetization method. FIGS. 7E and 7F show the magnetization state of the domain wall in the base state and the high energy state, respectively, in the in-plane magnetization method of an embodiment of the present invention.

FIGS. 8A to 8D show the nanowire width and the film thickness dependency in the conventional in-plane magnetization method. FIGS. 8E to 8H show the nanowire width and the film thickness dependency in the in-plane magnetization method of an embodiment of the present invention.

FIG. 11A is a front view, FIG. 11B is a side view, and FIG. 11C is a plan view (top view).

FIGS. 14A and 14B show the structure of a magnetoresistance effect element of Modification Examples 8 and 9.

DETAILED DESCRIPTION OF THE INVENTION

Below, a magnetoresistance effect element of an embodiment of the present invention, and a magnetic memory device using such a magnetoresistance effect element will be explained with reference to the figures.

Embodiment 1

Below, a magnetoresistance effect element of Embodiment 1 will be explained with reference to FIGS. 1 to 4.

Figure 1A:
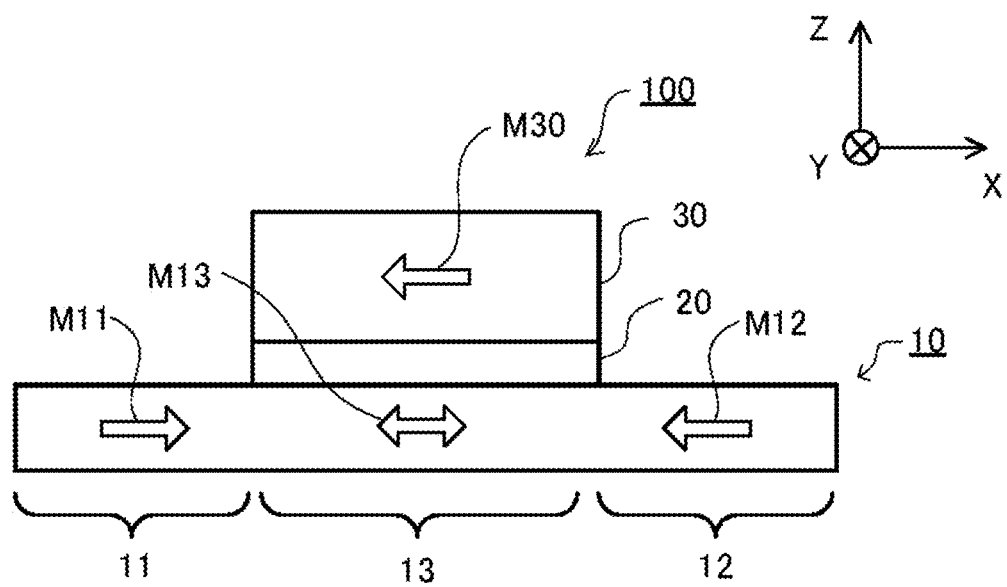
Figure 1B:
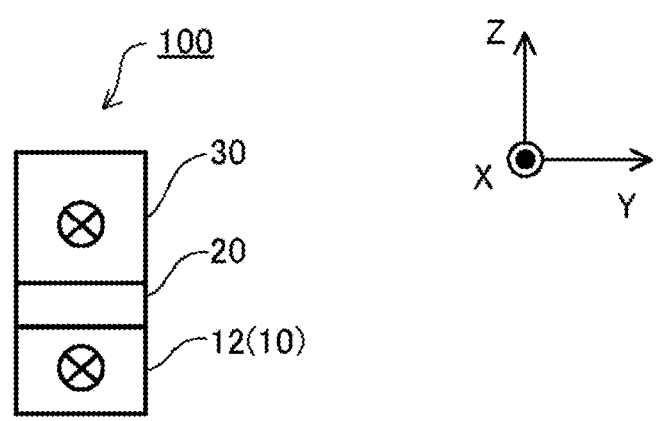

A magnetoresistance effect element 100 of Embodiment 1 includes a recording layer 10, a barrier layer 20, and a reference layer 30 stacked in this order as shown in the front view of FIG. 1A, the side view of FIG. 1B, and the plan view (top view) of FIG. 1C. In this embodiment, the lengthwise direction (extending direction) of the recording layer 10 (the direction toward right in FIG. 1A) is the X axis direction, the widthwise direction (the direction toward back in FIG. 1A) of the recording layer 10 is the Y axis direction, and the height direction along which the respective layers of the magnetoresistance effect element 100 are stacked (the direction toward top in FIG. 1A) is the Z axis direction.

The recording layer 10 is made of a ferromagnetic body including an element such as Fe, Co, or Ni. Specifically, the recording layer 10 is made of a 3d transition metal such as Fe, Co, and Ni, or an alloy including a 3d transition metal such as Fe—Co, Fe—Ni, Co—Ni, Fe—Co—Ni, Co—Fe—B, Fe—B, and Co—B. B. C, N, O, Al, Si, P, Ga, Ge, and the like may also be added to achieve a desired electrical property or structure.

Respective ends of the recording layer 10 in the lengthwise direction (X axis direction) are regions with fixed magnetization (magnetic field). The magnetic field on the left side of FIG. 1A is a first fixed magnetization region 11, and the magnetic field on the right side of FIG. 1A is a second fixed magnetization region 12. A region between the first fixed magnetization region 11 and the second fixed magnetization region 12 is a free magnetization region 13 in which the magnetization direction can be inverted.

The recording layer 10 is a layer having an easy magnetization axis in the in-plane direction. A magnetization direction M11 of the first fixed magnetization region 11 and a magnetization direction M12 of the second fixed magnetization region 12 are substantially fixed. The magnetization direction M11 and the magnetization direction M12 are opposite to each other. On the other hand, a magnetization direction M13 of the free magnetization region 13 can change, and is switched between +X axis direction and −X axis direction by the electric current flowing through the recording layer 10 upon data writing.

In the figure, the magnetization direction M11 of the first fixed magnetization region 11 is the +X axis direction, and the magnetization direction M12 of the second fixed magnetization region 12 is the −X axis direction, but the magnetization direction M11 and the magnetization direction M12 may also be opposite, respectively. That is, the magnetization direction M11 of the first fixed magnetization region 11 may be the −X axis direction, and the magnetization direction M12 of the second fixed magnetization region 12 may be the +X axis direction. The magnetization directions of the first fixed magnetization region 11 and second fixed magnetization region 12 do not have to be exactly along the +/−X axis directions, and an error of about +/−20 degrees is allowed.

With the configuration described above, a domain wall DW is formed between the first fixed magnetization region 11 and the second fixed magnetization region 12. The position where the domain wall DW is formed is determined by the magnetization direction M13 of the free magnetization region 13.

The wire width (length in the Y axis direction) of the recording layer 10 is 40 nm or less, and is preferably 30 nm or less. The film thickness (thickness in the Z axis direction) of the recording layer 10 is 40 nm or less, and is at least half but no more than twofold the wire width. When the width of the magnetic nanowire is 20 nm, for example, it is preferable that the film thickness be 10 nm or more and 40 nm or less.

The barrier layer 20 is a layer made of an insulator and formed on the recording layer 10. The barrier layer 20 is made of an insulator such as MgO, $Al_2O_3$, or AlN. If the barrier layer 20 is made of MgO, for example, the film thickness thereof is set to approximately 0.5 nm to 2.0 nm. More preferably, the film thickness is set to approximately 0.8 nm to 1.5 nm. By appropriately selecting the materials for the recording layer 10 and the barrier layer 20, a large tunnel magneto resistance (TMR) can be achieved. From this perspective, it is preferable that the recording layer 10 be CoFeB/MgO, and the barrier layer 20 be FeB/MgO. Alternatively, the recording layer 10 may have a multi-layer structure made of two or more different ferromagnetic layers, and the layer thereof adjacent to the barrier layer 20 may be made of CoFeB or FeB.

In the description above, the barrier layer 20 was formed on top of the recording layer 10, but here, "top" does not mean the top and bottom of the gravity direction. Thus, forming the barrier layer 20 on top of the recording layer 10 means forming the barrier layer 20 so as to be adjacent to the recording layer 10, for example. The barrier layer 20 does not necessarily have to be in contact with the recording layer 10, for example. Another layer or space may be interposed between the barrier layer 20 and the recording layer 10. This also applies to the relationship between the barrier layer 20 and the reference layer 30.

The reference layer 30 is a layer made of a ferromagnetic body and formed on the barrier layer 20. The magnetization direction M30 of the reference layer 30 is substantially fixed. The reference layer 30 includes Fe, Co, Ni, and the like. In order to fix the magnetization direction more securely, the reference layer 30 may also include an antiferromagnetic layer made of Ir—Mn, Pt—Mn, or the like. In the process of data-reading, information stored is read out in accordance with the magnetization directions of the reference layer 30 and the recording layer 10. In this example, the magnetization direction 30 is fixed in the –X axis direction.

In the figure, the reference layer 30 has the same shape as the barrier layer 20 in the X-Y plane, but the respective layers may have different shapes. For example, the barrier layer 20 may have the same shape as the recording layer 10, and the reference layer 30 may be formed to be smaller than that. The reference layer 30 needs to overlap with the free magnetization region 13 of the recording layer 10 in at least a part of the X-Y plane so that information is read out by the tunnel magneto resistance effect.

The length of the recording layer 10 in the X-axis direction is about 50 to 400 nm. In the recording layer 10, the length of the free magnetization region 13 in the X-axis direction is about 40 to 100 nm. The lengths of the first fixed magnetization region 11 and the second fixed magnetization region 12 in the X-axis direction are respectively about 40 to 200 nm. The length of the reference layer 30 in the X-axis direction is about 40 to 100 nm. In Embodiment 1, the reference layer 30 is formed so as not to be larger than the recording layer 10 in the X-Y plane. Thus, the length of the reference layer 30 in the Y-axis direction is no greater than 40 nm.

In order to form the recording layer 10, the barrier layer 20, and the reference layer 30, first, respective films for the recording layer 10, the barrier layer 20, and the reference layer 30 are deposited on a substrate (not shown in the figure) by super high vacuum sputtering method or the like. Thereafter, the deposited films are patterned into a desired shape by photolithography or the like. Heat treatment in a magnetic field may also be performed after the thin films are deposited or after the element is formed. In this case, the heat treatment temperature is 250 to 400 degrees, and the magnetic field is 0.2 T or greater and 2 T or smaller.

Below is one example of the configuration of each layer of the magnetoresistance effect element 100: the recording layer 10: CoFeB (20 nm-thick); the barrier layer 20: MgO (1.2 nm-thick); and the reference layer 30 (from the substrate side): CoFeB (1.5 nm-thick), CoFe (1 nm-thick), Ru (0.9 nm-thick), CoFe (2.5 nm-thick), PtMn (20 nm-thick).

Another example of the configuration of each layer of the magnetoresistance effect element 100 is as follows: the recording layer 10: NiFe (9 nm-thick), CoFeB (1 nm-thick); the barrier layer 20: MgO (0.9 nm-thick); and the reference layer 30 (from the substrate side): CoFeB (2 nm-thick), CoFe (1 nm-thick), Ru (0.9 nm-thick), CoFe (3 nm-thick), IrMn (12 nm-thick). In the configuration shown in the example, the reference layer has a multi-layer ferrimagnetic structure, and Ru functions as the coupling layer in the multi-layer ferrimagnetic structure.

The recording layer 10 may have an underlying layer (Ti, V, Cr, Zr, Nb, Mo, Hf, Ta, or W), or a seed layer (Cr, Fe, Ru, Rh, Pd, Ag, Cu, Jr, Pt, or Au) therebelow. The reference layer 30 may have a cap layer (Ta, Ru, or Cu) thereabove. The underlying layer, the seed layer, and the cap layer are formed as necessary in order to improve the contact with the substrate, crystal orientation, electrical conductivity, and anti-corrosion property.

The preferable ranges of the film thickness and dimensions described above were set based on the technical standards of the current semiconductor integrated circuit, and the ranges of film thickness and dimensions that can achieve the effects of the present invention may be modified as the processing technique progresses in the future.

The magnetization direction M13 of the free magnetization region 13 of the recording layer 10 changes between the +X-axis direction and –X-axis direction. This changes the resistance state of the respective layers from the recording layer 10 to the reference layer 30 of the magnetoresistance effect element 100 between the high resistance state and the low resistance state. By assigning bit data of "0" and "1" to the respective resistance states, and changing the resistance states, data can be stored in the magnetoresistance effect element 100. When data is to be read out from the magnetoresistance effect element 100, a reading current Jr is given between an electrode (not shown in the figure) formed on the reference layer 30 and the recording layer 10 so that the resistance state (either high resistance state or low resistance state) of the magnetoresistance effect element 100 is detected. This way, data stored in the magnetoresistance effect element 100 is read out.

Below, the reading operation and writing operation will be explained in detail.

Figure 2A:
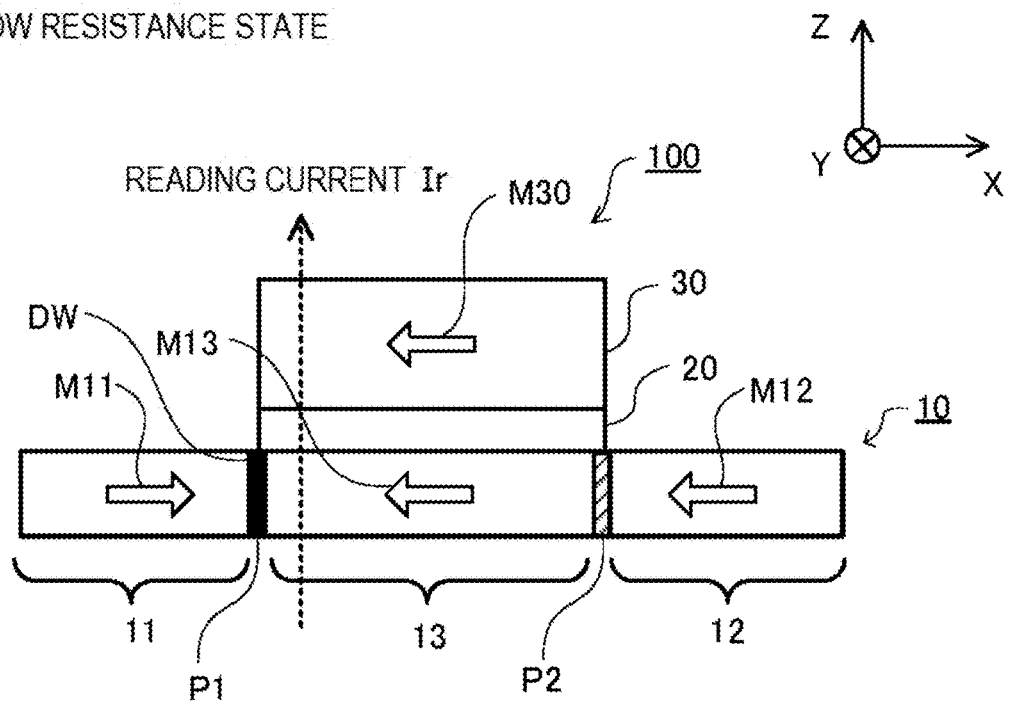
FIGS. 2A and 2B are diagrams for explaining the reading operation for reading out data stored in the magnetoresistance effect element.

First, the reading operation will be explained with reference to FIGS. 2A and 2B. In the state of FIG. 2A, the magnetization direction M13 of the free magnetization region 13 of the recording layer 10 is in the –X axis direction, which is the same as the magnetization direction M12 of the second fixed magnetization region 12. Thus, a domain wall DW is formed in a region P1 between the first fixed magnetization region 11 and the free magnetization region 13. The magnetization direction M13 of the free magnetization region 13 coincides with the magnetization direction M30 of the reference layer 30 (parallel state). In this state, the magnetoresistance effect element 100 is in the low resistance state in which the resistance of the current channel from the recording layer 10 to the reference layer 30 is relatively small. The magnetization direction M13 and the magnetization direction M30 do not have to be completely parallel to each other, and may be substantially parallel to each other.

Figure 2B:
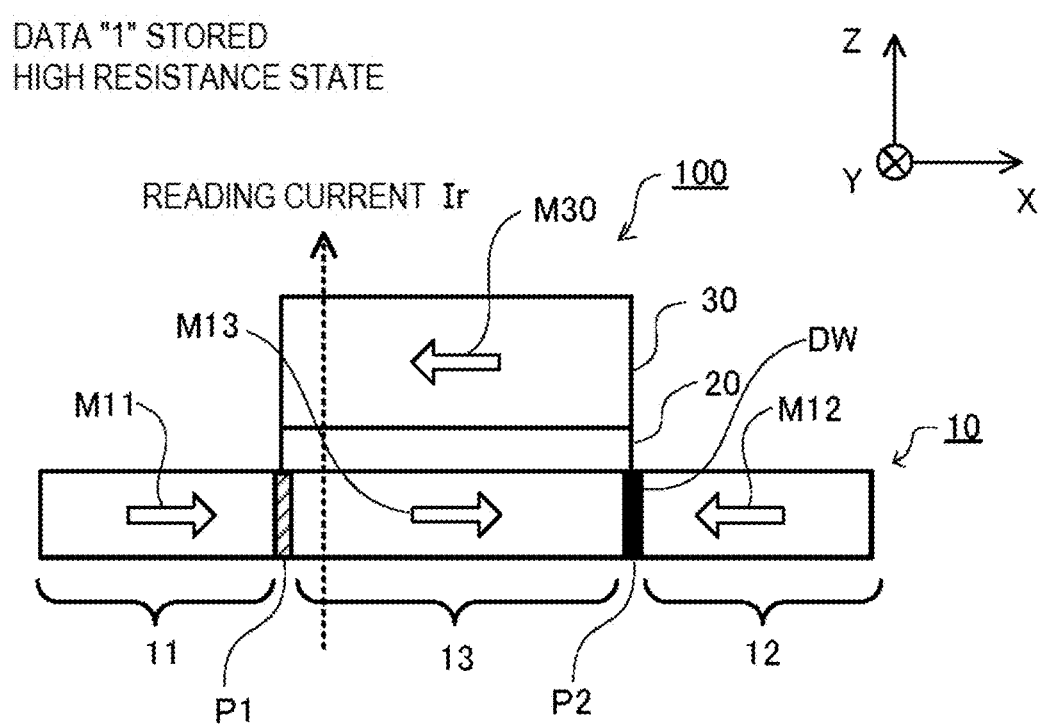

On the other hand, in the state of FIG. 2B, the magnetization direction M13 of the free magnetization region 13 of the recording layer 10 is in the +X axis direction, which is the same as the magnetization direction M11 of the first fixed magnetization region 11. Thus, a domain wall DW is formed in a region P2 between the second fixed magnetization region 12 and the free magnetization region 13. The magnetization direction M13 of the free magnetization region 13 is opposite to the magnetization direction M30 of the reference layer 30 (anti-parallel state). In this state, the magnetoresistance effect element 100 is in the high resistance state in which the resistance of the current channel from the recording layer 10 to the reference layer 30 is relatively large. The magnetization direction M13 and the magnetization direction M30 do not have to be completely anti-parallel to each other, and may be substantially anti-parallel to each other.

The domain wall DW changes the position thereof between the region P1 and the region P2 depending on the magnetization direction M13 of the free magnetization region 13. In other words, the magnetoresistance effect element 100 stores a different type of data depending on the position of the domain wall DW.

In this embodiment, the low resistance state shown in FIG. 2A is "0," and the high resistance state shown in FIG. 2B is "1," but the each state may be assigned with the other type of data. The figure shows the reading current Jr flowing in the +Z axis direction, but the flowing direction of the reading current Jr may be opposite. Also, FIG. 2 shows the configuration in which the reading current Jr flows from the recording layer 10 toward the reference layer 30, but in order to achieve the effect of the present invention, as long as a current flows in the direction that runs through the magnetic tunnel junction made of the recording layer 10, the barrier layer 20, and the reference layer 30, the current may take any routes.

Next, the writing operation will be explained with reference to FIGS. 3 and 4. In this example, the magnetization direction M13 of the free magnetization region 13 of the magnetoresistance effect element 100, which has the data "0" stored therein, is the −X axis direction. The magnetization direction M13 and the magnetization direction M30 of the reference layer 30 are the same as each other, and the domain wall DW is in the region P1 between the first fixed magnetization region 11 and the free magnetization region 13. That is, the magnetoresistance effect element 100 is in the low resistance state.

Figure 3A:
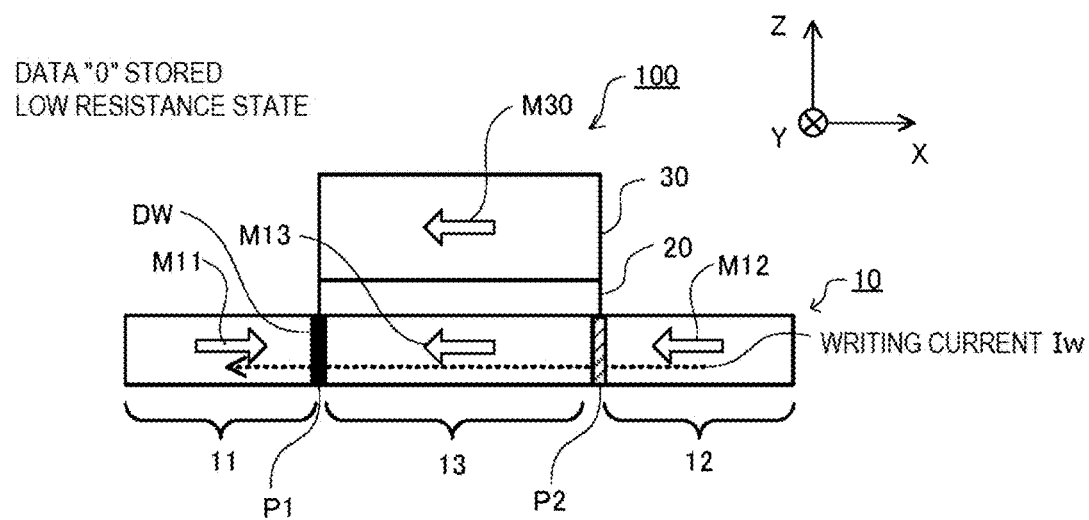
FIGS. 3A to 3C are diagrams for explaining the operation to write data "1" into the magnetoresistance effect element.
Figure 3B:
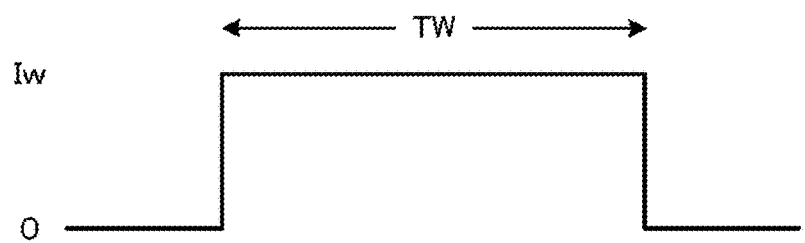
Figure 3C:
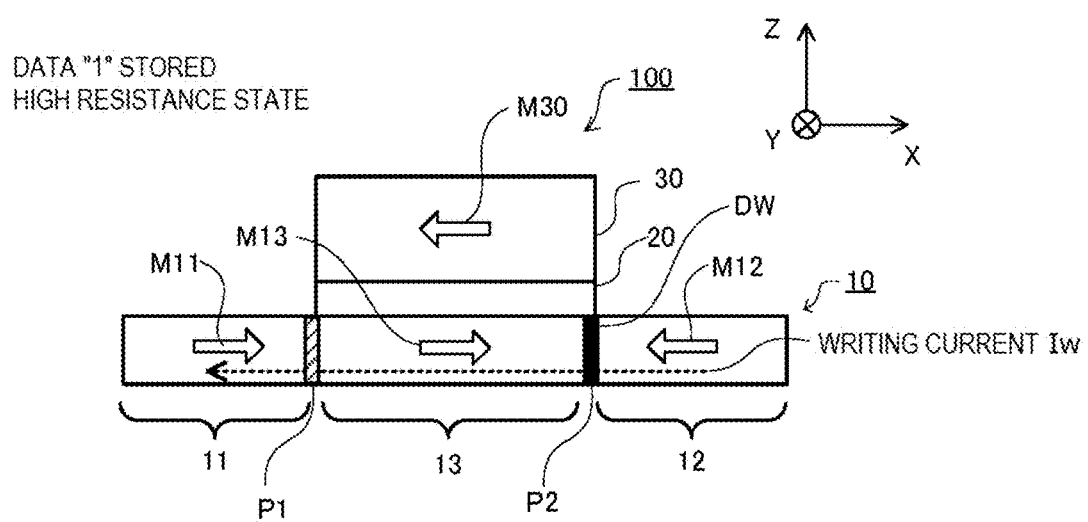

In order to write data "1" into the magnetoresistance effect element 100 that has the data "0" stored therein, the writing current Iw is made to flow in the −X axis direction as shown in FIG. 3A so as to have the pulse form as shown in FIG. 3B. The writing current Iw flows from the second fixed magnetization region 12 to the first fixed magnetization region 11 through the free magnetization region 13. In this case, electrons (spin electrons) are injected into the free magnetization region 13 from the first fixed magnetization region 11. The spin of the injected electrons affects the magnetic moment of the domain wall DW (spin-transfer effect). As a result, as shown in FIG. 3C, the domain wall DW moves from the region P1 to the region P2, and the magnetization direction M13 of the free magnetization region 13 is changed to the +X axis direction. This makes the magnetoresistance effect element 100 enter the high resistance state. This way, the stored data of the magnetoresistance effect element 100 is written over from "0" to "1." Even after the writing current Iw goes down to 0, the magnetization direction M13 of the free magnetization region 13 stays the same.

Figure 4A:
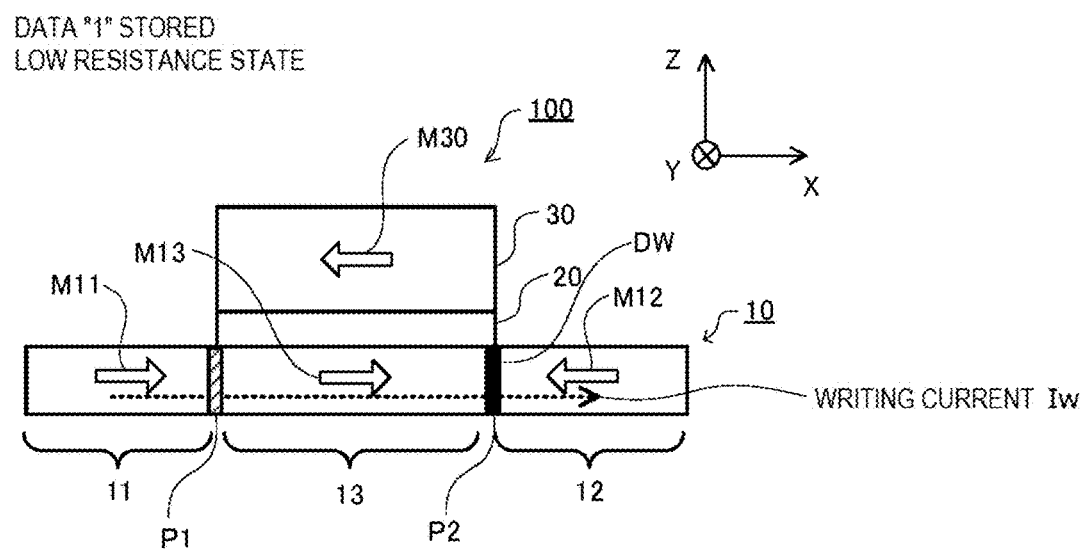
FIGS. 4A to 4C are diagrams for explaining the operation to write data "0" into the magnetoresistance effect element.
Figure 4B:
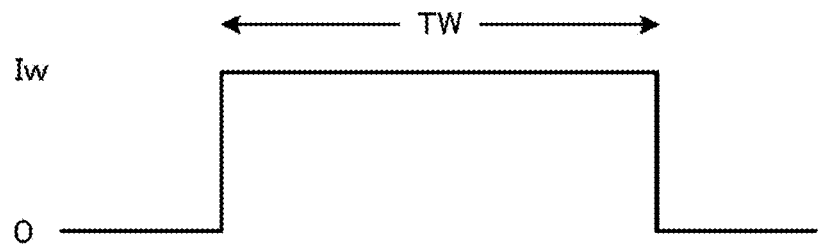
Figure 4C:
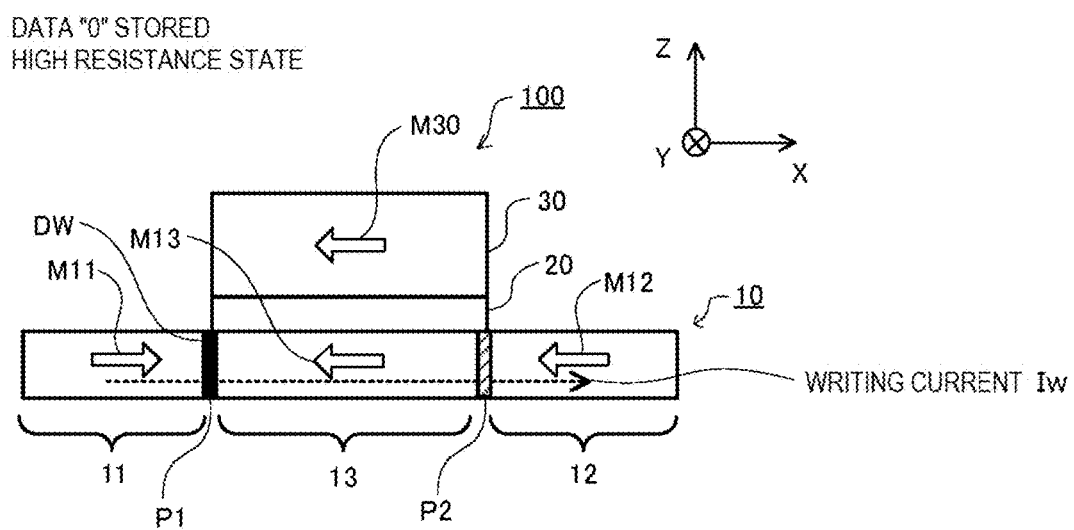

On the other hand, in order to write data "0" into the magnetoresistance effect element 100 that has the data "1" stored therein, the writing current Iw is made to slow in the +X axis direction as shown in FIG. 4A so as to have the pulse form as shown in FIG. 4B. The writing current Iw flows from the first fixed magnetization region 11 to the second fixed magnetization region 12 through the free magnetization region 13. In this case, spin electrons are injected into the free magnetization region 13 from the second fixed magnetization region 12. Due to the spin transfer effect, as shown in FIG. 4C, the domain wall DW moves from the region P2 to the region P1, and the magnetization direction M13 of the free magnetization region 13 is changed to the −X axis direction. This makes the magnetoresistance effect element 100 enter the low resistance state. This way, the stored data of the magnetoresistance effect element 100 is written over from "1" to "0." Even after the writing current Iw goes down to 0, the magnetization direction M13 of the free magnetization region 13 stays the same. Rewriting of the data stored in the magnetoresistance effect element 100 is performed in this way.

The magnetization direction M11 of the first fixed magnetization region 11 and the magnetization direction M12 of the second fixed magnetization region 12 are respectively fixed. Thus, even when the writing current Iw of the +X axis direction is given to the magnetoresistance effect element 100 that has the data "0" stored therein (even when the data "0" is written into), the data rewriting due to the spin transfer torque does not occur, and the domain wall DW does not move. Similarly, even when the writing current Iw of the −X axis direction is given to the magnetoresistance effect element 100 that has the data "1" stored therein, the domain wall DW does not move.

The relationship between the direction of the writing current Iw and the moving direction of the domain wall DW varies depending on the materials used for the recording layer 10.

The current pulse width TW shown in FIGS. 3B and 4B is set to 0.5 to 20 ns, and more preferably set to 0.8 ns to 5 ns. In FIGS. 3B and 4B, the current pulse has a rectangular shape, but in the actual situation, the pulse may have a trapezoid shape including definite rise time and fall time. The typical values of the rise time and fall time are 0 to 2 ns. The current pulse does not have to have an exact rectangular shape or trapezoid shape, and may be a triangle shape. Furthermore, because the magnetoresistance effect element of the present invention has a large operation margin upon writing, a relatively large overshoot, undershoot, and ringing is allowed.

Next, a memory circuit using, as a memory cell, the magnetoresistance effect element 100 having the configuration described above will be explained with reference to FIG. 5A.

Figure 5A:
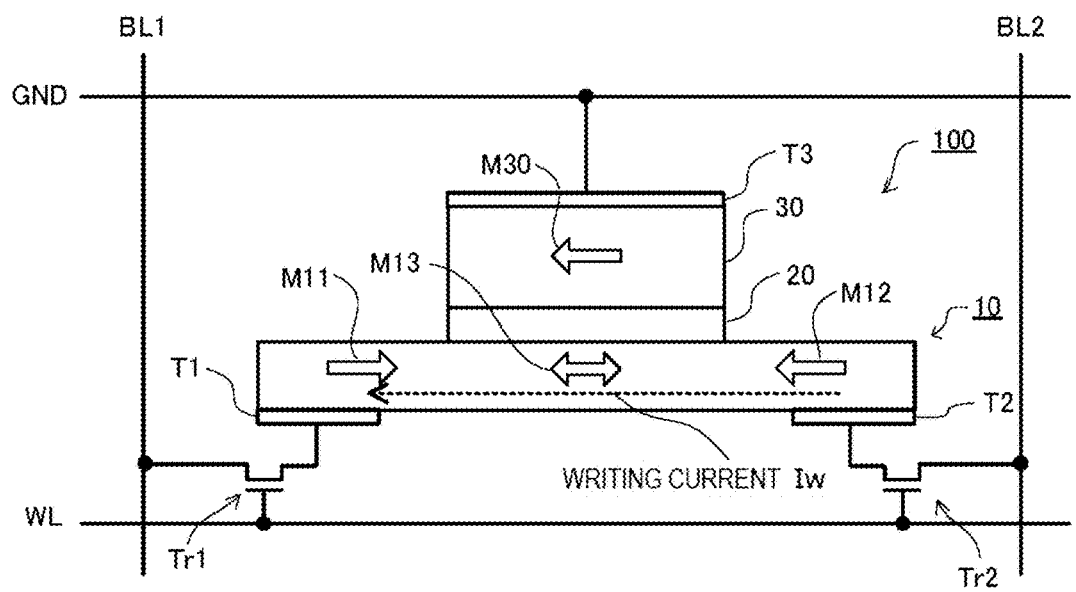
FIG. 5A is a diagram showing the circuit configuration of a memory cell circuit for one bit using a magnetoresistance effect element of Embodiment 1.

FIG. 5A shows the configuration of a magnetic memory cell circuit 200 for one bit. The magnetic memory cell circuit 200 includes the magnetoresistance effect element 100 constituting a memory cell for one bit, a pair of bit lines BL1 and BL2, a word line WL, a ground line GND, a first transistor Tr1 and a second transistor Tr2.

The magnetoresistance effect element 100 has a three-terminal structure in which a first terminal T1 connected to one end of the recording layer 10, a second terminal T2 is connected to the other end thereof, and a third terminal T3 is connected to the reference layer 30. More specifically, the first terminal Ti is connected to one end of the first fixed magnetization region 11, and the second terminal T2 is connected to one end of the second fixed magnetization region 12.

The third terminal T3 is connected to the ground line GND. The first terminal T1 is connected to the drain of the first transistor Tr1, and the second terminal T2 is connected to the drain of the second transistor Tr2. The gate electrodes of the first transistor Tr1 and the second transistor Tr2 are connected to the word line WL. The source of the first transistor Tr1 is connected to the first bit line BL1 and the source of the second transistor Tr2 is connected to the second bit line BL2.

Figure 5B:
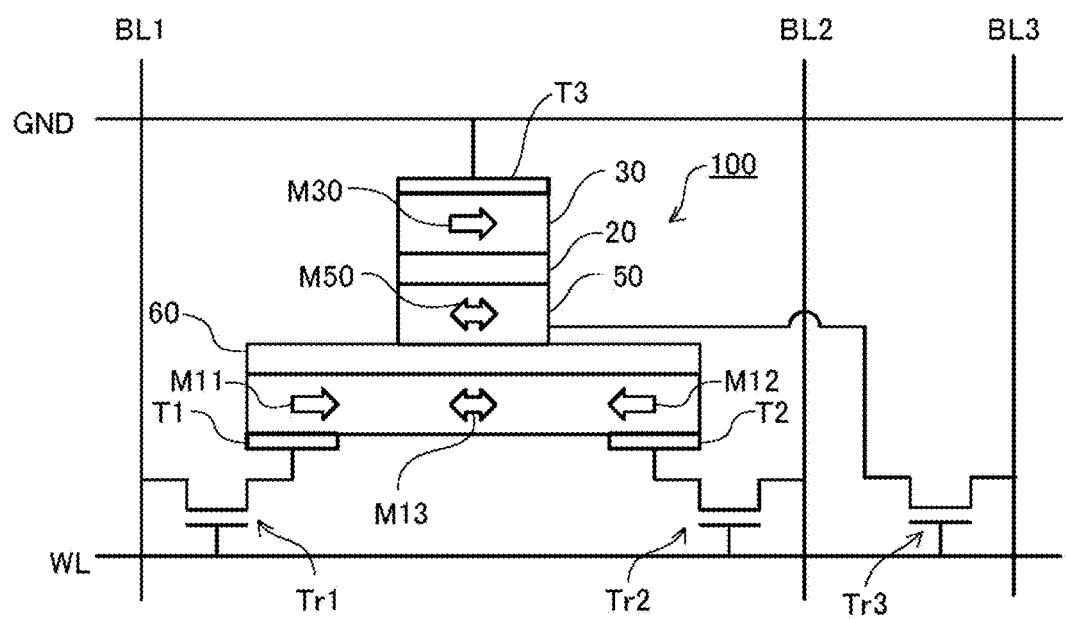
FIG. 5B is a diagram for explaining the four-terminal structure.

The magnetoresistance effect element 100 does not have to have the three-terminal structure, and may have a four-terminal structure as shown in FIG. 5B, for example. In this example, a new magnetic layer (sensor layer 50) is formed below the barrier layer 20. An insulating layer 60 is formed between the sensor layer 50 and the recording layer 10 to electrically insulate them. The sensor layer 50 is magnetically coupled with the free magnetization region 13 in the recording layer 10, and the magnetization direction M50 of the sensor layer 50 changes depending on the magnetization direction of the free magnetization region 13 in the recording layer 10. When the magnetic tunnel junction is formed by the sensor layer 50, barrier layer 20, and reference layer 30, it is possible to employ the four-terminal structure in which the first terminal T1 and the second terminal T2 are connected to the respective terminals of the recording layer 10, the third terminal T3 is connected to the reference layer 30, and the fourth terminal is connected to the sensor layer 50. In case of the four-terminal structure, the current channels are electrically separated between writing and reading, which allows for a greater degree of freedom in circuit design. In the example of FIG. 5B, the insulating layer 60 was formed between the recording layer 10 and the sensor layer 50, but alternatively, it is possible to form, between the recording layer 10 and the sensor layer 50, a conductive layer made of a material that is compatible with the materials of the recording layer 10 and the sensor layer 50. The magnetic coupling may be magnetostatic coupling or interactive coupling.

When information is to be written into the magnetoresistance effect element 100, first, an active level signal is applied to the word line WL to turn on the transistors Tr1 and Tr2 so as to select the magnetoresistance effect element 100. In this example, the transistors Tr1 and Tr2 are made of an N-channel MOS transistors. In this case, the word line WL is set to the high level. This turns on the first transistor Tr1 and the second transistor Tr2. On the other hand, one of the first bit line BL1 and the second bit line BL2 is set to the high level, and the other is set to the ground level, depending on the type of data to be written.

Specifically, when data "1" is to be written, the first bit line BL1 is set to the low level, and the second bit line BL2 is set to the high level. This causes the writing current Iw to flow in the direction from the second fixed magnetization region 12 to the first fixed magnetization region 11 (forward direction) as shown in FIG. 3A, and the data "1" is written in as shown in FIG. 3B. On the other hand, when data "0" is to be written, the first bit line BL1 is set to the high level, and the second bit line BL2 is set to the low level. This causes the writing current Iw to flow in the direction from the first fixed magnetization region 11 to the second fixed magnetization region 12 (reverse direction) as shown in FIG. 4A, and the data "0" is written in as shown in FIG. 4B. This way, the bit data is written into the magnetoresistance effect element 100.

On the other hand, when the information stored in the magnetoresistance effect element 100 is to be read out, the word line WL is set to the active level so that the first transistor Tr1 and the second transistor Tr2 are turned on. Then both the first bit line BL1 and the second bit line BL2 are set to the high level, or one of the bit lines BL1 and BL2 is set to the high level, and the other is set to the open state. From the bit line that is set to the high level, a current flows from the recording layer 10 to the ground line GND through the barrier layer 20, the reference layer 30, and the third terminal T3. By measuring the size of this current, the size of the resistance in the channel from the recording layer 10 to the reference layer 30, or in other words, the stored data can be obtained.

The configuration and the circuit operation of the magnetic memory cell circuit 200 are merely one example, and may be appropriately modified. For example, the first terminal T1 may be connected to the second fixed magnetization region 12, and the second terminal T2 may be connected to the first fixed magnetization region 11. The ground may be set to a reference voltage instead of the ground voltage. The third terminal may be connected to the third bit line (not shown in the figure), instead of the ground line GND. In this case, when the data is to be read out, the word line WL is set to the high level, the third bit line is set to the high level, and one or both of the first bit line and the second bit line is set to the ground level. In this state, the current flowing from the third bit line to the first bit line BL1 and the second bit line BL2 is measured.

Next, the configuration of a magnetic memory device 300 including a plurality of the magnetic memory cell circuits 200 of FIG. 5A will be explained with reference to FIG. 6.

Figure 6:
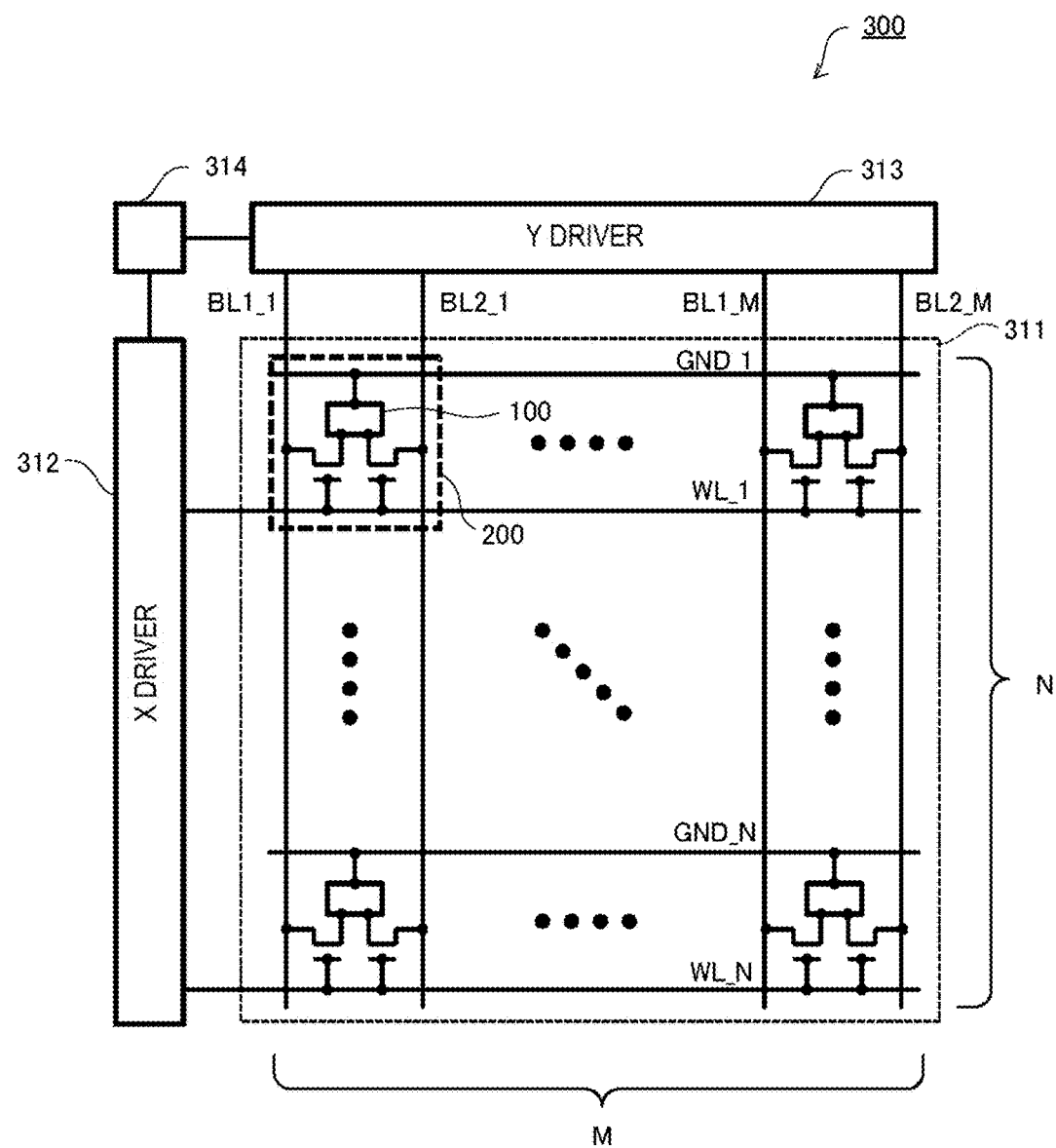
FIG. 6 is a block diagram of a magnetic memory device including a plurality of memory cell circuits shown in FIG. 5A.

As shown in FIG. 6, the magnetic memory device 300 includes a memory cell array 311, an X driver 312, a Y driver 313, and a controller 314. The memory cell array 311 has the magnetic memory cell circuits 200 arranged in an N-row M-column array. The magnetic memory cell circuit 200 of each column is connected to a pair of the first bit line BL1 and the second bit line BL2 of the corresponding column. The magnetic memory cell circuit 200 of each row is connected to the word line WL and the ground line GND of the corresponding row.

The X driver 312 is connected to a plurality of word lines WL, and is configured to receive a row address, decode the row address, and activate the word line WL to allow access (to the high level when the first transistor Tr1 and the second transistor Tr2 are N-channel MOS transistors).

The Y driver 313 functions as a writing means for writing data into the magnetoresistance effect element 100 and a reading means for reading out the data from the magnetoresistance effect element 100. The Y driver 313 is connected to a plurality of first bit lines BL1 and second bit lines BL2. When the data is to be written or read out, the Y driver 313 receives a column address, decodes the column address, and sets the first bit line BL1 and the second bit line BL2 connected to the magnetic memory cell circuit 200 to be accessed to a desired data writing state or reading state.

That is, when the data "1" is to be written, the Y driver sets the first bit line BL1 and the second bit line BL2 connected to the magnetic memory cell circuit 200, in which the data is to be written, to the low level and the high level, respectively. On the other hand, when data "0" is to be written, the first bit line BL1 is set to the high level, and the second bit line BL2 is set to the low level.

When the information stored in the magnetic memory cell circuit 200 is to be read out, the Y driver 313 sets both the first bit line BL1 and the second bit line BL2 to the high level, or sets one of the bit lines BL1 and BL2 to the high level, and the other to the open state. The Y driver 313 then compares the current flowing through the bit lines BL1 and BL2 with the reference value, determines the resistance state of the magnetic memory cell circuit 200 of each column, and reads out the stored data.

The controller 314 controls the X driver 312 and the Y driver 313 when data is written in or read out.

The ground line GND connected to the reference layer 30 of the magnetoresistance effect element 100 is connected to the X driver 312, but as described above, this can be replaced with the read-out bit line connected to the Y driver 313.

In the embodiment described above, the width of the magnetic nanowire and film thickness of the recording layer 10 of the magnetoresistance effect element 100 was set to 40 nm or smaller, and the film thickness was set to at least half but no more than twofold the width of the magnetic nanowire. Below, how limiting the design value of the fire wire of the recording layer 10 to a certain range allows for the domain wall movement with a low threshold current density will be explained.

First, in order to operate a current induced domain wall movement device stably with a low current, it is effective to achieve a low threshold current density. The threshold current density $J_c$ of the current induced domain wall movement is represented by the following formula.

$$J_c = \frac{eM_s}{\hbar P}\Delta H_{K\perp} \quad \text{Formula 1}$$

e: elementary charge
$\hbar$: Dirac's constant
$M_s$: Saturation magnetization
P: Spin polarization rate
$\Delta$: Domain wall width parameter
$H_{K\perp}$: Hard axis anisotropic magnetic field e and $\hbar$ (below the Dirac's constant may be represented by $\hbar$) are physical constants. Ms and P are parameters determined by the material of the element. $\Delta$ and $H_{K\perp}$ are parameters for the domain wall. Generally, a material with a small saturated magnetization Ms has a small spin polarizability P. Thus, it is difficult to reduce the threshold current density $J_c$ by Ms/P.

This means that in order to reduce the threshold current density $J_c$, it is effective to use a material that can make smaller the values of the domain wall width parameter $\Delta$ and the hard axis anisotropic magnetic field $H_{K\perp}$.

The domain wall width parameter $\Delta$ has a relationship of $\delta w=\pi$ with the domain wall width $\delta w$. Also, the domain wall width parameter $\Delta$ is represented by the following formula by the exchange stiffness constant A and the effective magnetic field anisotropic constant $K_{eff}$ in the easy axis direction.

$$\Delta=\sqrt{A/K_{eff}} \quad \text{Formula 2}$$

A: Exchange stiffness constant
$K_{eff}$: Effective magnetic anisotropic constant The hard axis anisotropic magnetic field $H_{K\perp}$ is the size of the magnetic field that represents the difference in energy when the magnetization direction of the domain wall is oriented to the two directions other than the magnetic easy axis.

In the early stage of the study on the current induced domain wall movement, an NiFe alloy having the magnetization easy axis in the in-plane direction was often used. In the researches at that time, the width of the NiFe magnetic nanowire was in the 100 nm order, and the film thickness was in the 10 nm order. In this case, the domain wall width $\delta w$ is about 100 nm. The hard axis anisotropic magnetic field $H_{K\perp}$ corresponds to a difference in energy between the case in which the magnetization direction of the domain wall coincides with the Y axis direction as shown in FIG. 7A and the case in which the magnetization direction of the domain wall coincides with the Z axis direction as shown in FIG. 7B. In other words, the hard axis anisotropic magnetic field $H_{K\perp}$ represents the difference between the state in which the magnetization appears on the $\delta w\times t$ plane (FIG. 7A) and the state in which the magnetization appears on the $\delta w\times w$ plane (FIG. 7B). In this case, the logical threshold current density obtained through calculation is in the order of $10^{13}$ to $10^{14}$ A/m$^2$. However, it is not possible to provide a current with such a large current density to the element, and if a current density is smaller than this, the joule heat generation would occur, which would make the element operation unstable.

WO2009/001706 proposes the use of the vertical magnetization method instead of the in-plane magnetization method as a solution to the problem described above. In the vertical magnetization method, the film thickness is set to several nm, and the domain wall width $\delta w$ is set to about 10 nm. The hard axis anisotropic magnetic field $H_{K\perp}$ corresponds to a difference in energy between the case in which the magnetization direction of the domain wall coincides with the Y axis direction as shown in FIG. 7C and the case in which the magnetization direction of the domain wall coincides with the Z axis direction as shown in FIG. 7D. In other words, the hard axis anisotropic magnetic field $H_{K\perp}$ represents the difference between the state in which the magnetization appears on the $\delta w\times t$ plane (FIG. 7C) and the state in which the magnetization appears on the $w\times t$ plane (FIG. 7D). In this case, the logical threshold current density obtained through calculation is in the order of $10^{11}$ A/m$^2$. This mitigates the adverse effect of the joule heat generation, and it was confirmed that this configuration can achieve a desired domain wall movement property.

However, even in the vertical magnetization method, if the wire width of the magnetic nanowire was further reduced, the domain wall movement with a low current density would not be achieved. If the wire width w is greater than the domain wall width, Bloch domain wall is formed as shown in FIG. 7C, but if the wire width w is smaller than the domain wall width, Nair domain wall is formed as shown in FIG. 7D, and as the difference between the wire width w and the domain wall width increases, the hard axis anisotropic magnetic field $H_{K\perp}$ increases.

FIGS. 8A to 8D show the results of the micromagnetic simulation with various magnetic nanowire widths w for the respective film thicknesses t of 2, 4, and 6 nm when the vertical magnetization method is employed.

Figures 8A, 8B, 8C, 8D, 8E, 8F, 8G, 8H:
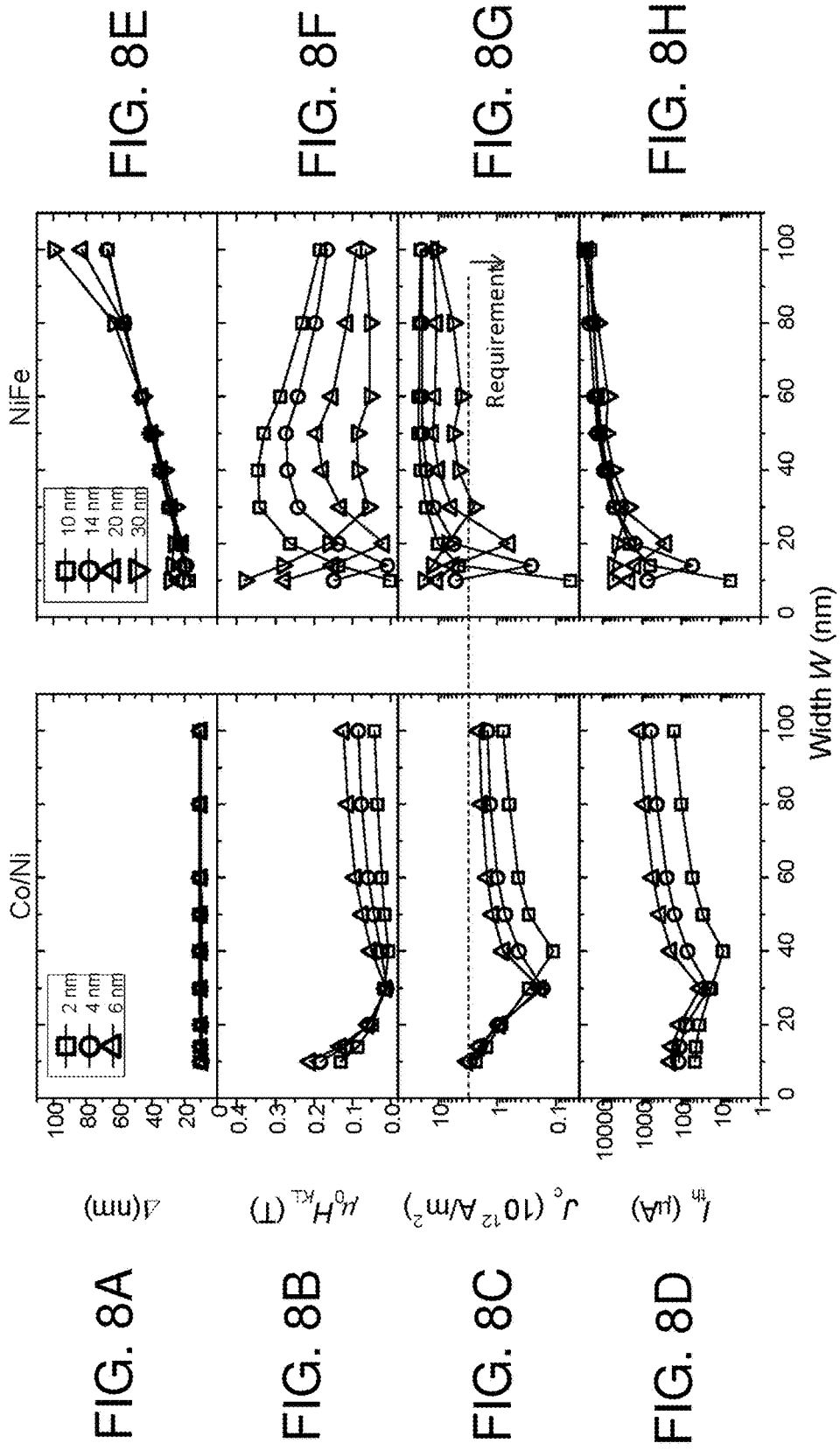
FIG. 8A to 8H are diagrams showing the result of the micromagnetic simulation.

Specifically, FIG. 8A shows the dependency of the domain wall width parameter $\Delta$ on the magnetic nanowire width w and the film thickness t. In this example, the value of the domain wall parameter $\Delta$ corresponding to the wire width w and the film thickness t was obtained. The wire width w was made to vary at a certain interval in a range from 10 nm to 100 nm during the simulation. The same applies to FIGS. 8B to 8D.

FIG. 8B shows the dependency of the hard axis anisotropic magnetic field $H_{K\perp}$ on the magnetic nanowire width w and the film thickness t. In this example, $\mu 0H_{K\perp}$ was obtained as a value that represents the hard axis anisotropic magnetic field corresponding to the wire width w and the film thickness t. μ0 is a magnetic permeability in vacuum.

As described above, the threshold current density $J_c$ is determined by the product of the domain wall width parameter Δ and the hard axis anisotropic magnetic field $H_{K\perp}$, and therefore, the threshold current density $J_c$ was obtained based on the resultant value of FIGS. 8A and 8B. Then the threshold current $I_{th}$ was obtained by multiplying the threshold current density $J_c$ by the cross-sectional area of the magnetic nanowire. FIG. 8C shows the threshold current density $J_c$, and FIG. 8D shows the threshold current $I_{th}$. Ms/P (parameter determined by the element material) in Formula 1 is the value obtained based on the evaluation value of the magnetization curve when a Co/Ni multilayer film was used for the magnetic nanowire. The physical constant of the Co/Ni multi-layer film was also used for the calculation of the domain wall width parameter Δ and the hard axis anisotropic magnetic field $H_{K\perp}$. Specifically, the saturated magnetization Ms was 0.96 T, and the magnetic anisotropic constant of the easy axis direction (Z-axis direction) was $6.1 \times 10^5$ J/m$^3$.

As shown in FIG. 8A, the value of the domain wall width parameter Δ does not change almost at all even when the wire width w and the film thickness t change. This means that in the vertical magnetization method, the domain wall width parameter Δ does not depend on the wire width w and the film thickness t.

On the other hand, as shown in FIG. 8B, $\mu0H_{K\perp}$ decreases as the wire width w decreases, and starts increasing again in the range below 30 nm. This tendency was observed in any of the cases where the film thickness t was 2 nm, 4 nm and 6 nm.

Thus, as shown in FIG. 8C, when the wire width w is 20 nm or smaller, the threshold current density $J_c$ goes above $1 \times 10^{12}$ A/m2, which is the value that allows for a stable operation free from the effect of the Joule heat generation. This means that in the vertical magnetization method, if the wire width w is 20 nm or smaller, the stable operation cannot be achieved.

On the other hand, in the in-plane magnetization method, as described in Embodiment 1, the threshold current density can be reduced by limiting the design value of the wire width and film thickness of the magnetic nanowire to a certain range. The hard axis anisotropic magnetic field is a difference between the case in which the magnetization of the domain wall appears on the δw×t plane as shown in FIG. 7E, and the case in which the magnetization of the domain wall appears on the δw×w plane as shown in FIG. 7F. When the wire width w and the film thickness t were equal to each other, or in other words, t=w, the hard axis anisotropic magnetic field is expected to be almost zero. When the wire width w is smaller, the magnetic shape anisotropy in the magnetic domains at the right and left sides (respective sides) of the domain wall increases, and as a result, the effective magnetic anisotropy constant $K_{eff}$ that affects the domain wall width parameter Δ increases, which makes the domain wall width parameter Δ smaller.

FIGS. 8E to 8H show the results of the micromagnetic simulation when the magnetic nanowire of the recording layer 10 has the respective different sizes (wire width and film thickness) in the in-plane magnetization method as described in Embodiment 1.

Specifically, FIG. 8E shows the dependency of the domain wall width parameter Δ on the magnetic nanowire width w and the film thickness t. In this example, the value of the domain wall parameter Δ corresponding to the wire width w and the film thickness t was obtained. The film thickness t has four patterns of 10 nm, 14 nm, 20 nm, and 30 nm, and the wire width w was changed at a prescribed interval in the range from 10 nm to 100 nm. The same applies to FIGS. 8F to 8H.

FIG. 8F shows the dependency of the hard axis anisotropic magnetic field $H_{K\perp}$ on the magnetic nanowire width w and the film thickness t. In this example, $\mu0H_{K\perp}$ was obtained as a value that represents the hard axis anisotropic magnetic field corresponding to the wire width w and the film thickness t. μ0 is a magnetic permeability in vacuum.

FIG. 8G shows the threshold current density $J_c$, and FIG. 8H shows the threshold current $I_{th}$. Ms/P (parameter determined by the element material) in Formula 1 is the value obtained based on the evaluation value of the magnetization curve when NiFe was used for the magnetic nanowire. The physical constant of NiFe was also used for the calculation of the domain wall width parameter Δ and the hard axis anisotropic magnetic field $H_{K\perp}$. Specifically, the saturated magnetization Ms was 1.0 T, and the magnetic anisotropic constant of the easy axis direction (Z-axis direction) was 0 J/m$^3$.

As shown in FIG. 8F, when the wire width w is at a prescribed value or smaller (20 nm or smaller in this example) and the wire width w and the film thickness t are substantially equal to each other, the hard axis anisotropic magnetic field $H_{K\perp}$ takes the smallest value. At this time, as shown in FIG. 8G, the threshold current density $J_c$ is no greater than $1 \times 10^{12}$ A/m$^2$, which can be applied to the element.

In the in-plane magnetization film, the domain wall width parameter Δ and the hard axis anisotropic magnetic field $H_{K\perp}$ are determined by the magnetic nanowire width and the film thickness, and show a qualitative tendency of not depending on the material constant almost at all. Thus, this calculation result qualitatively applies to any in-plane magnetization film, even though FIGS. 8A-8H show the simulation results of the case in which NiFe was used for the material of the magnetic nanowire.

Figure 9A:
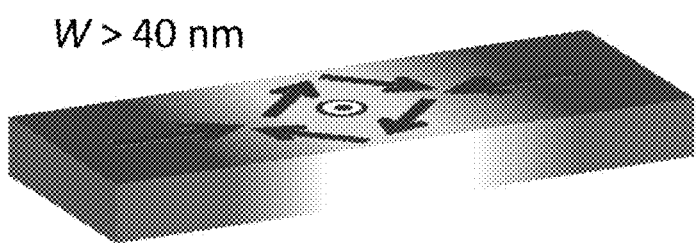
FIG. 9A is a diagram showing the domain wall generated when the width of the magnetic nanowire is 40 nm or greater.

This simulation result shows that there is an upper limit on the wire width w to make the hard axis anisotropic magnetic field $H_{K\perp}$ take the smallest value by forming the magnetic nanowire such that the wire width w and the film thickness t are substantially the same. When the wire width w is 40 nm or greater, even if the wire width w is made to be substantially equal to the film thickness t, the hard axis anisotropic magnetic field $H_{K\perp}$ does not take the smallest value. This is because, as shown in FIG. 9A, when the wire width w is relatively large (40 nm or more when NiFe was used for the material of the magnetic nanowire), the domain wall takes the Vortex structure. It is known that when the Vortex domain wall is moved by a current, the domain wall exhibits a probabilistic behavior (Physical Review Letters, vol. 95, 026601 (2005) and the like). That is, the controllability of the domain wall movement is unstable.

Figure 9B:
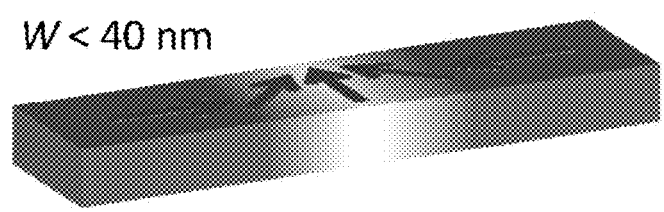
FIG. 9B is a diagram showing the domain wall generated when the width of the magnetic nanowire is less than 40 nm.

On the other hand, when the wire width is 40 nm or less, the domain wall takes the transverse structure as shown in FIG. 9B both in the stable state and during the domain wall movement. Therefore, as shown in the simulation conducted by the inventors of the present invention, the stable controllability can be achieved. If the film thickness is smaller than the wire width (t<w), the magnetization in the transverse type domain wall is aligned with the magnetic nanowire widthwise direction in the film plane. On the other hand, if the film thickness is greater than the wire width (t>w), the magnetization in the transverse type domain wall is aligned with the vertical direction to the film plane.

The effect described above (the hard axis anisotropic magnetic field $H_{K\perp}$ takes the smallest value) is achieved ideally when the wire width w and the film thickness t are equal to each other, but actually, it is difficult to make the wire width w and the film thickness t completely equal to each other due to processing errors from the ideal shape, variations in magnetic property in places, and the like. However, according to the simulation, when the wire width w and the film thickness t is no greater than 40 nm, and the film thickness is at least half but no more than twofold the wire width, the threshold current density $J_c$ can be $1 \times 10^{12}$ A/m² or smaller.

When the vertical magnetic anisotropy appears at the interface, similar effects can be achieved by making the film thickness t smaller (thinner) than the wire width w. For example, when CoFeB and FeB are used for the recording layer, and MgO is used for the barrier layer, the vertical magnetic anisotropy appears at the interface, but in this case, by making the film thickness t fall within a range of 25% to 75% of the wire width, the maximum effect of the present invention can be achieved.

As shown in FIG. 8H, when the film thickness and wire width are 10 nm or smaller, the threshold current $I_{th}$ is 5.7 µA, and such a small threshold current cannot be obtained in the vertical magnetization method. Thus, when the magnetoresistance effect element of the present invention is used for a magnetic memory, a dynamic power consumption of the at-joule level can be realized.

Figure 10:
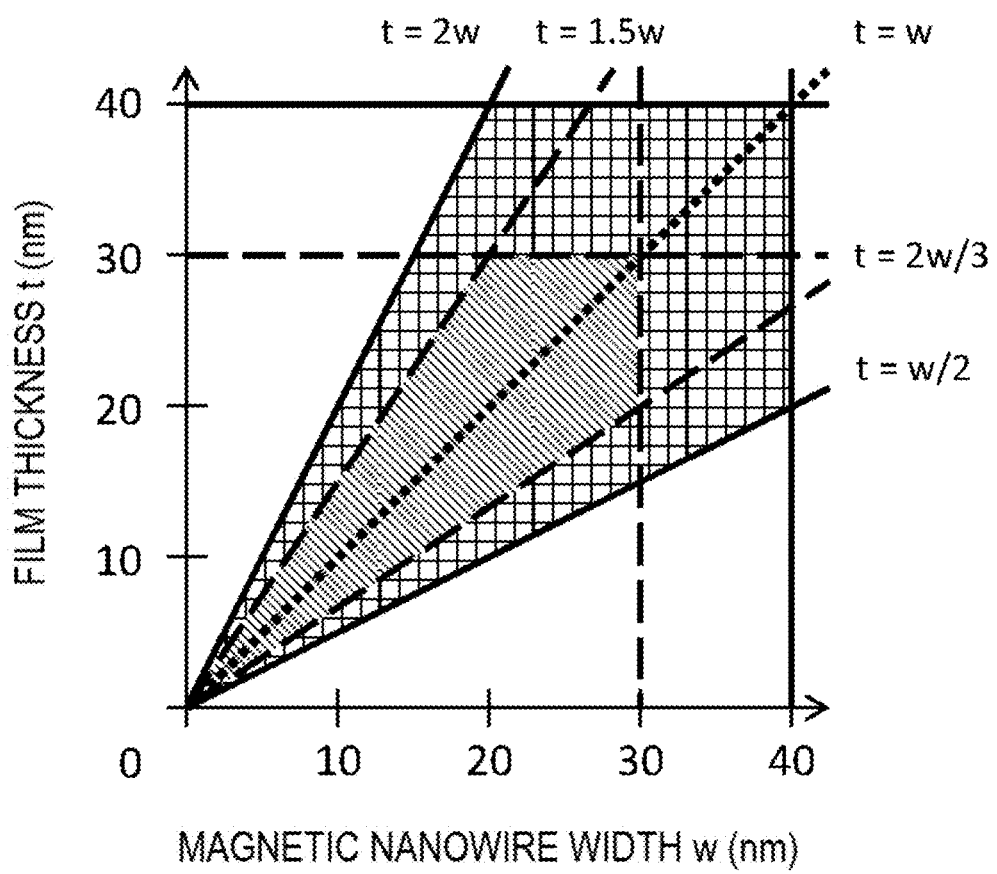
FIG. 10 is a diagram showing the preferred design range of the width of the magnetic nanowires and the film thickness.

FIG. 10 shows a preferred design range of the wire width w and film thickness t calculated based on the micromagnetic simulation results performed using the material parameter of NiFe. In the case of NiFe, when the wire width and the film thickness exceed 30 nm, the domain wall takes the Vortex structure in a stable state and during the domain wall motion process. As described above, the Vortex domain wall would cause an unstable operation, and therefore, the upper limit of wire width and film thickness is set to 30 nm. As shown in FIG. 8G, the minimum threshold current density is obtained when the film thickness t and wire width w are equal to each other (t=w). Thus, the greatest effect of the present invention is achieved when the thickness t and the wire width W is equal to each other.

The upper limit of the current density that can be introduced into the NiFe magnetic nanowire is approximately $3 \times 10^{12}$ A/m². In FIG. 8G, when the film thickness t is at least two-thirds but no more than one and half times the wire width w, this condition would met. Thus, in the case of NiFe magnetic nanowire, the lower limit of the film thickness t to obtain the effect of the present invention is two-thirds of the wire width w, and the upper limit is one and half times the wire width w (inside of the hatch area in FIG. 10). When using parameters that are suitable to materials other than NiFe (for example, a material having a small saturation magnetization, a material having a high spin polarization ratio, a material having a high exchange stiffness constant, or a material having a large magnetic anisotropy in the magnetic nanowire lengthwise direction), the preferred design range is relaxed, and the area subjected to hatching in the in-plane and vertical directions (above t=w/2, below t=40, right of t=2 w, and left of w=40) in FIG. 10. That is, the wire width w and the film thickness t are 40 nm or smaller and the film thickness is at least half but no more than twofold the wire width.

As described above, in the magnetoresistance effect element 100 of this embodiment, when the magnetic nanowire width is small, or more specifically, when the wire width is 40 nm or smaller, the domain wall can be moved with a low threshold current density.

Also, because there are not many materials that have the vertical magnetization, there is a limitation of the material selection in the vertical magnetization method, but if the in-plane magnetization method is employed, the broader range of material would be available.

There is no physical constraints on the lower limit of the magnetic nanowire width, and the lower limit value varies depending on the processing technique. In order to make magnetic nanowire smoothly without causing variations, the crystal grain size plays an important role, and therefore, the lower limit value of the wire width is about 5 nm. Also, in the ultra-fine generation of approximately 10 nm or below, a bottom-up approach such as self-organization may be used to form magnetic nanowires, rather than a top-down method such as photolithography. In this case, the wire width need to be large enough for the ferromagnetic property to be expressed. The wire width allowing for the expression of ferromagnetic property largely depends on the material used, but when using a material that has a large exchange interaction, the wire width is about 3 nm. The same lower limited value of the magnetic nanowire width applies to the descriptions below.

Embodiment 2

In order to stably write and read data into and from the magnetoresistance effect element 100 of Embodiment 1, it is necessary to secure the magnetization direction M30 of the reference layer 30. In order to secure the magnetization direction M30 of the reference layer 30, it is effective to form the reference layer 30 of a multi-layer ferromagnetic coupling layer.

Figure 11A:
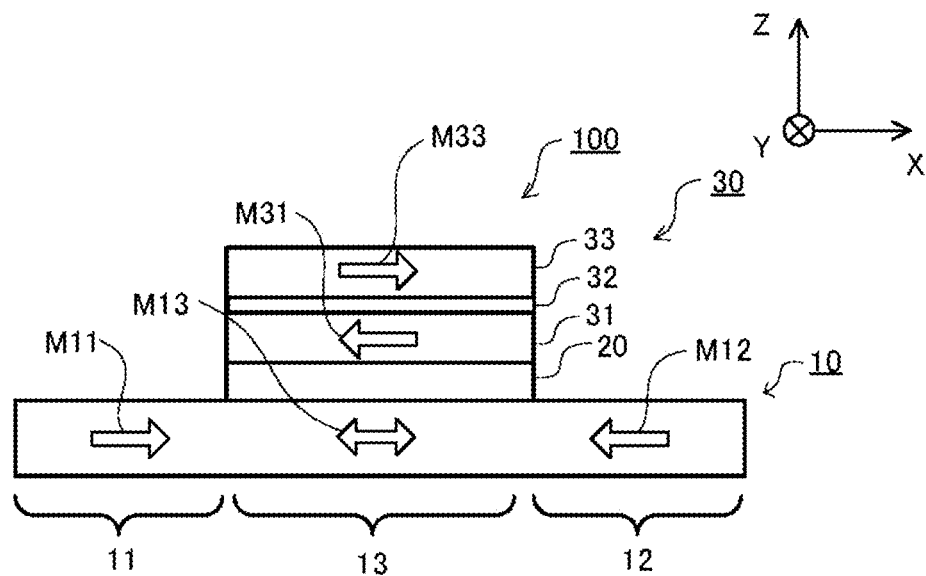
FIGS. 11A to 11C are diagrams showing the structure of a magnetoresistance effect element of Embodiment 2 of the present invention.
Figure 11B:
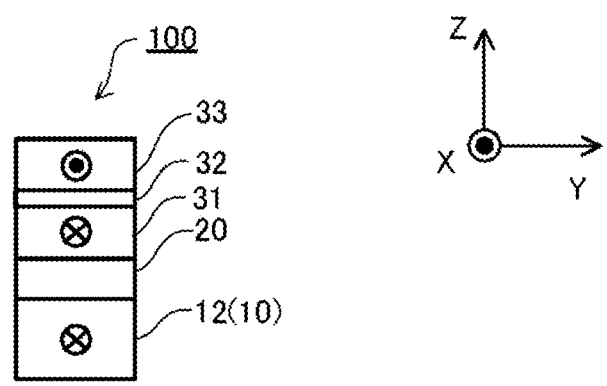
Figure 11C:
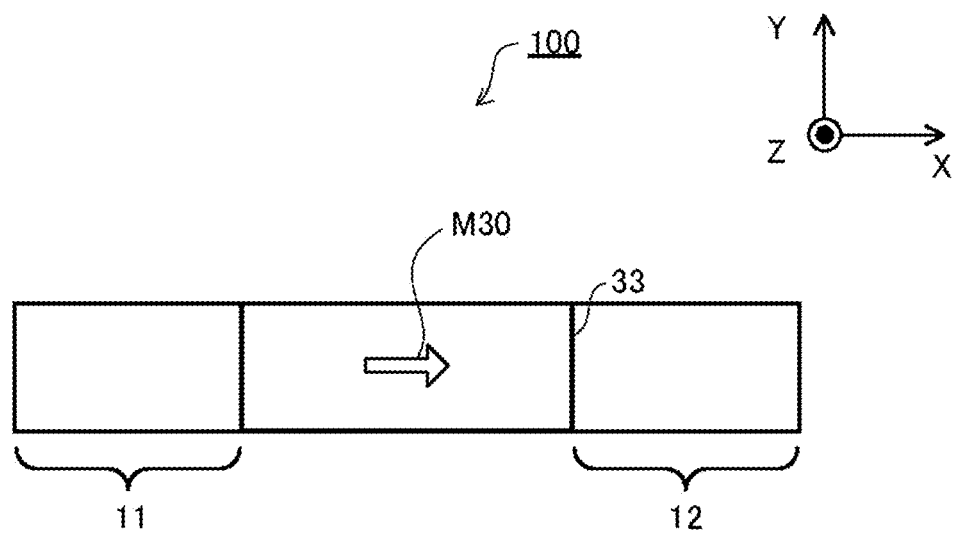

Below an embodiment of a magnetoresistance effect element 101 in which the reference layer 30 is made of a multi-layer ferromagnetic coupling layer will be explained with reference to FIG. 11.

In Embodiment 2, the reference layer 30 includes a ferromagnetic layer 31, a coupling layer 32, and a ferromagnetic layer 33, which forming a multi-layer structure with ferromagnetic coupling. The ferromagnetic layer 31 and the ferromagnetic layer 33 are coupled with each other via the coupling layer 32 in an anti-ferromagnetic manner. It is preferable to use a ferromagnetic material such as Fe, Co, and NI for the ferromagnetic layer 31 and the ferromagnetic layer 33. It is preferable to use Ru and the like for the coupling layer 32. Other configurations are the same those of Embodiment 1.

With this configuration, when the magnetization direction M13 of the free magnetization region 13 of the recording layer 10 coincides with the magnetization direction M31 of the ferromagnetic layer 31 that is closer to the recording layer 10 than the ferromagnetic layer 33, the magnetoresistance effect element 101 enters the parallel state, i.e., low resistance state. On the other hand, when the magnetization direction M13 of the free magnetization region 13 of the recording layer 10 is opposite to the magnetization direction M31 of the ferromagnetic layer 31, the magnetoresistance effect element 101 enters the anti-parallel state, i.e., the high resistance state.

Similar to Embodiment 1, it is possible to drive the domain wall with a low threshold current density in Embodiment 2.

The present invention is not limited to the embodiments described above, and various modification s are possible. Modification examples and application examples will be explained below.

Modification Example 1

The combination of the resistance levels and data types can be appropriately changed, and it is also possible to assign the data "1" to the low resistance state and the data "0" to the high resistance state.

Modification Example 2

Figure 12A:
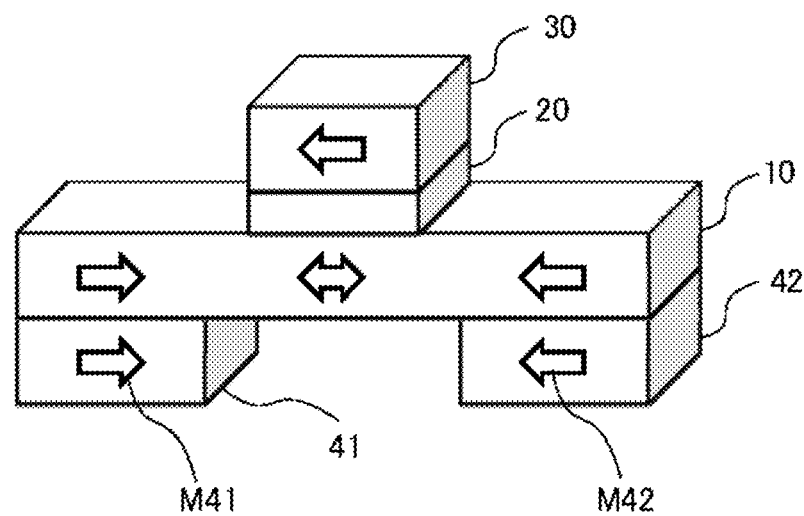
FIGS. 12A to 12D show the structure of a magnetoresistance effect element of Modification Examples 2 to 5.

The magnetoresistance effect element 100 may further include a layer that strengthens the magnetization of the first fixed magnetization region 11 and the second fixed magnetization region 12 of the recording layer 10. As shown in FIG. 12A, in Modification Example 2, a first magnetization fixing layer 41 is formed below the first fixed magnetization region 11, and the magnetization direction M41 thereof coincides with the magnetization direction M11 of the first fixed magnetization region 11. A second magnetization fixing layer 42 is formed below the second fixed magnetization region 12, and the magnetization direction M42 thereof coincides with the magnetization direction M12 of the second fixed magnetization region 12.

Modification Example 3

Figure 12B:
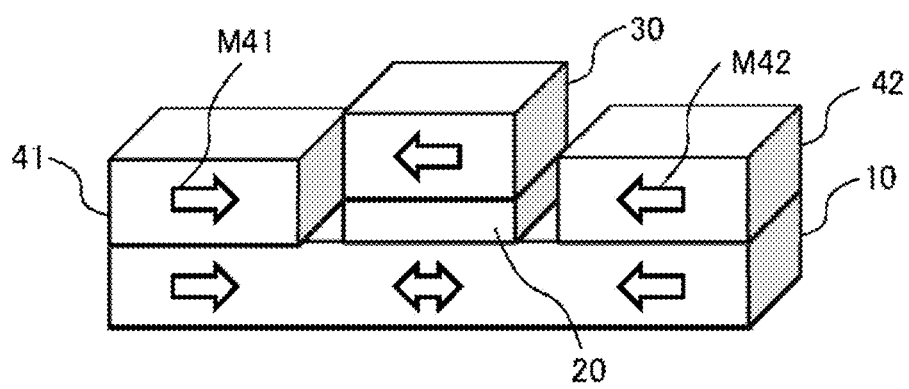

Alternatively, as shown in FIG. 12B, the first magnetization fixing layer 41 and the second magnetization fixing layer 42 may be formed on the recording layer 10. In this example, the first magnetization fixing layer 41 is formed on the first fixed magnetization region 11, and the second magnetization fixing layer 42 is formed on the second fixed magnetization region 12. Similar to Modification Example 2, the magnetization direction M11 of the first fixed magnetization region 11 is secured by the first magnetization fixing layer 41, and the magnetization direction M12 of the second fixed magnetization region 12 is secured by the second magnetization fixing layer 42.

Modification Example 4

Figure 12C:
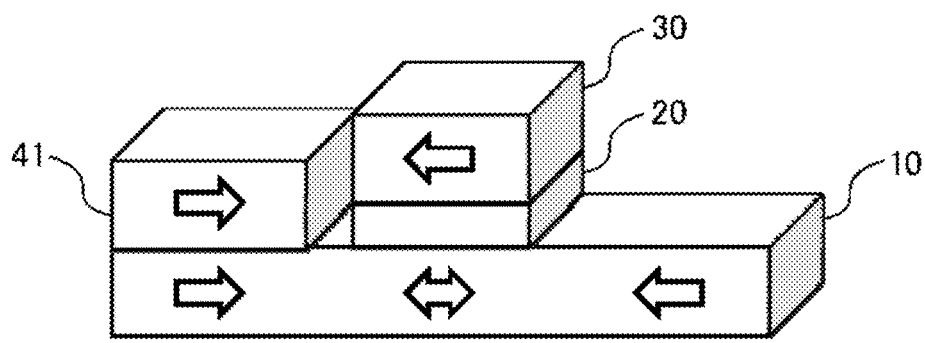

Alternatively, the magnetoresistance effect element 100 may have only one of the first magnetization fixing layer 41 and the second magnetization fixing layer 42. In the example of FIG. 12C, the first magnetization fixing layer 41 is formed on the first fixed magnetization region 11, and the magnetoresistance effect element 100 does not have the second magnetization fixing layer 42 to secure the magnetization direction M12 of the second fixed magnetization region 12. The first magnetization fixing layer 41 may be formed below the first fixed magnetization region 11. Alternatively, the magnetoresistance effect element 100 may have the second magnetization fixing layer 42 above or below the second fixed magnetization region 12 instead of the first magnetization fixing layer 41 for securing the magnetization direction M11 of the first fixed magnetization region 11.

The first magnetization fixing layer 41 and the second magnetization fixing layer 42 can be formed of a ferromagnetic material such as Fe, Co, and Ni, or anti-ferromagnetic material such as Ir—Mn, Pt—Mn, and Fe—Mn. Further, the magnetization direction of the first magnetization fixing layer 41 and the first fixed magnetization region 11 does not necessarily have to be parallel to the magnetization direction of the second magnetization fixing layer 42 and the second fixed magnetization region 12, and may be coupled in the anti-parallel direction to secure the magnetization.

Modification Example 5

Figure 12D:
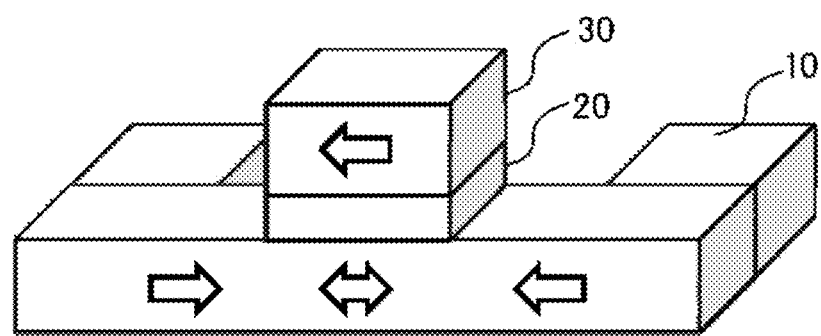

In Embodiment 1 described above, as shown in FIG. 1C, the recording layer 10 has a rectangular shape in a top view (shape in the X-Y-plane), but the shape of the recording layer 10 is not limited to this. In the example shown in FIG. 12D, the recording layer 10 is pattered so that the shape in the X-Y plane has a recess. With this configuration, it is possible to introduce a single magnetic domain wall in the recording layer 10 using an external magnetic field in the in-plane direction.

Modification Example 6

Figure 13A:
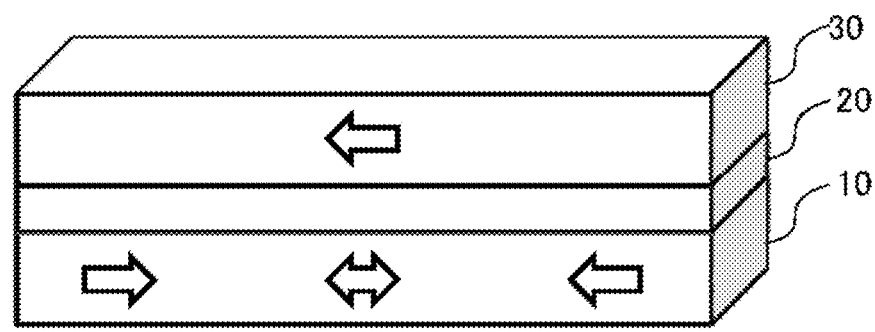
FIGS. 13A and 13B show the structure of a magnetoresistance effect element of Modification Examples 6 and 7.

In Embodiment 1, the barrier layer 20 and the reference layer 30 are stacked on the upper surface of the free magnetization region 13 of the recording layer 10. This is because it is necessary that at least the reference layer 30 overlaps the free magnetization region 13 of the recording layer 10. However, the multi-layer structure is not limited thereto, and as shown in FIG. 13A, the barrier layer 20 and the reference layer 30 may be stacked on the entire upper surface of the recording layer 10. This would make it easier to manufacture the multi-layer structure.

Modification Example 7

Figure 13B:
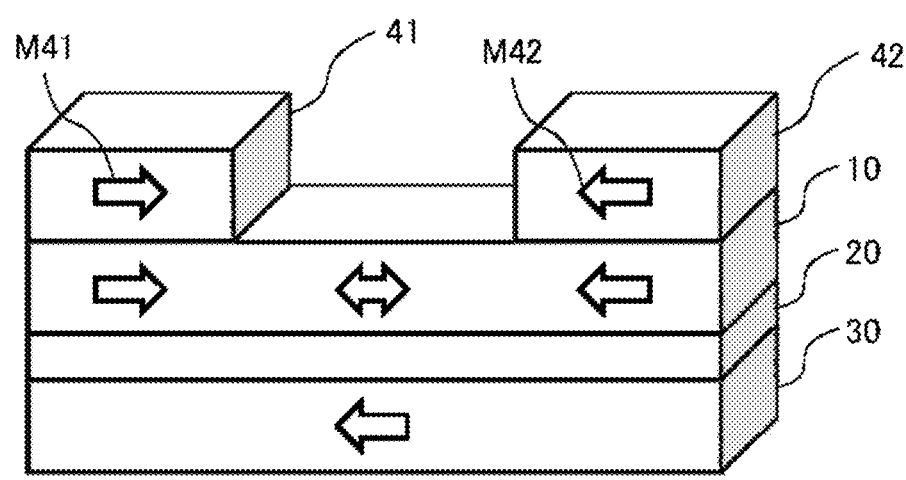

Furthermore, the recording layer 10 does not necessarily have to be on the bottom, and as shown in FIG. 13B, it is also possible to form the reference layer 30, barrier layer 20, and recording layer 10 in this order from the substrate side. In this case, the reference layer 30 is patterned so as to have a shape that has an area equal to or greater than the recording layer.

Modification Example 8

In the examples described above, the magnetoresistance effect element 100 includes one reference layer 30, but it is also possible to provide a plurality of reference layers as shown in FIG. 14A. In this case, a region of the recording layer 10 in adjacent to each reference layer 30 functions as the free magnetization region. With this configuration, the magnetoresistance effect element 100 may function as a multi-value memory or an analog memory.

Modification Example 9

As shown in FIG. 14B, the recording layer 10 may include a plurality of free magnetization regions, and the reference layer 30 may be extended in the lengthwise direction so as to cover those plurality of free magnetization regions. Similar to Modification Example 8, with this configuration, the magnetoresistance effect element 100 may function as a multi-value memory or an analog memory.

Modification Example 10

Figure 15A:
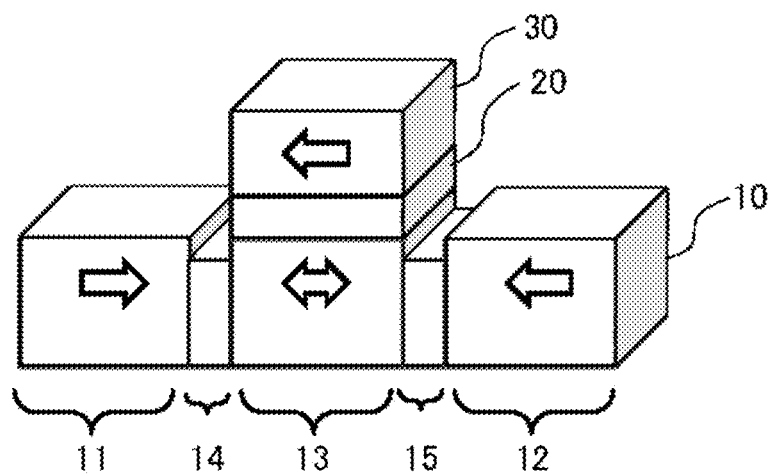
FIGS. 15A to 15D show the structure of a magnetoresistance effect element of Modification Examples 10 to 13.

FIG. 15A shows an example of forming pin sites for the domain wall in the recording layer 10. In this example, notches (pin sites) are formed on the top surface of the recording layer 10 (XY plane) between the first fixed magnetization region 11 and the free magnetization region 13

(14) and between the second fixed magnetization region 12 and the free magnetization region 13 (15), respectively. The pin sites stop the movement of the domain wall DW. The pin site may only be formed in one of the locations described above.

Modification Example 11

Figure 15B:
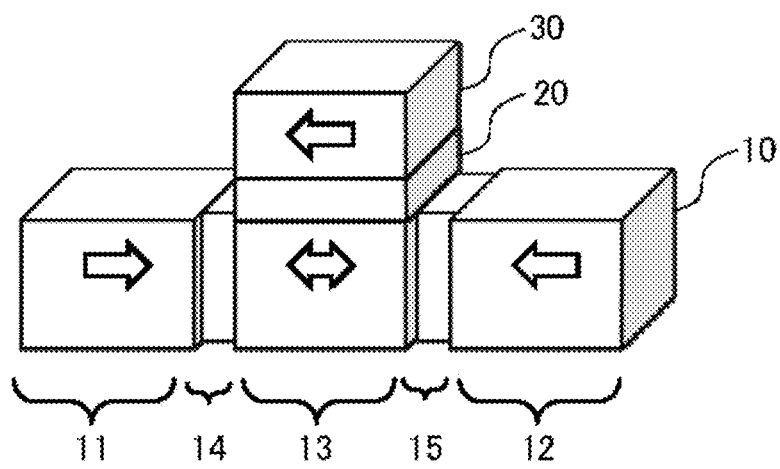

The locations of the pin sites are not limited to the example described above. In the example shown in FIG. 15B, notches (pin sites) are formed on the front surface of the recording layer 10 (XZ plane) between the first fixed magnetization region 11 and the free magnetization region 13 (14) and between the second fixed magnetization region 12 and the free magnetization region 13 (15), respectively. In this case as well, the pin sites can stop the movement of the domain wall DW. The pin site may only be formed in one of the locations described above.

Modification Example 12

Figure 15C:
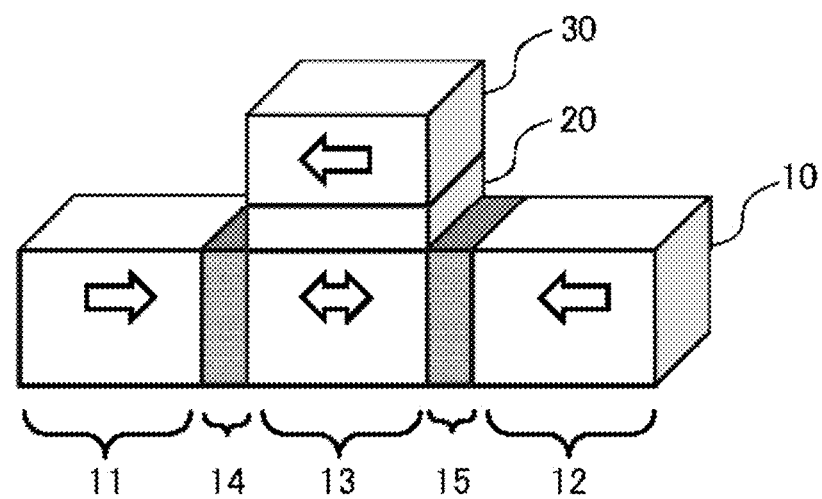

Alternatively, instead of forming the notches in the recording layer 10, the pin sites can be provided by forming regions with different material properties between the first fixed magnetization region 11 and the free magnetization region 13 (14) and between the second fixed magnetization region 12 and the free magnetization region 13 (15), respectively. FIG. 15C shows an example of the shape of the magnetoresistance effect element 100 according to Modification Example 12. In this example, the colored portions are the regions with different material properties. The pin site may only be formed in one of the locations described above.

Modification Examples 10, 11, and 12 with the pin site can be combined with Modification Examples 8 and 9 in which the magnetoresistance effect element 100 can be used as a multi-value memory or an analog memory. In this case, a pin site is formed inside of the free magnetization region or between the respective free magnetization regions.

In addition to forming pin sites, the domain wall can be stably pinned in the information holding state by appropriately designing the planer shape and cross-sectional shape of the first fixed magnetization region 11 and the second fixed magnetization region 12. For example, as revealed from the simulation results shown in FIG. 8, by designing the element such that the magnetic nanowire width and film thickness are 40 nm or smaller, and the film thickness is at least half but no more than twofold the wire width, it is possible to move the domain wall with a low current density. This means that if the element is designed such that the dimensions are out of this range, it would be difficult for the domain wall to move. Therefore, by making the film thickness of the first fixed magnetization region 11 and the second fixed magnetization region 12 less than half or more than twofold the wire width, the domain wall does not move in the first fixed magnetization region 11 or the second fixed magnetization region 12. Furthermore, in such an embodiment, the first fixed magnetization region 11 and the second fixed magnetization region 12 take a shape differing from that of the free magnetization region 13 in the Y-Z cross-section. Generally, because the domain wall is pinned strongly in a place where there is a difference in cross-sectional shape, this difference in shape will function as an effective pin site for the domain wall.

In one example, the pinning mechanism described above can be achieved by designing the element such that the wire width of the free magnetization region 13 is 15 nm, the film thickness thereof is 15 nm, the wire width of the first fixed magnetization region 11 and the second fixed magnetization region 12 is 35 nm and the film thickness thereof is 15 nm. In another example, the pinning mechanism described above can be achieved by designing the element such that the wire width of the free magnetization region 13 is 20 nm, the film thickness thereof is 20 nm, the wire width of the first fixed magnetization region 11 and the second fixed magnetization region 12 is 20 nm and the film thickness thereof is 9 nm.

Modification Example 13

Figure 15D:
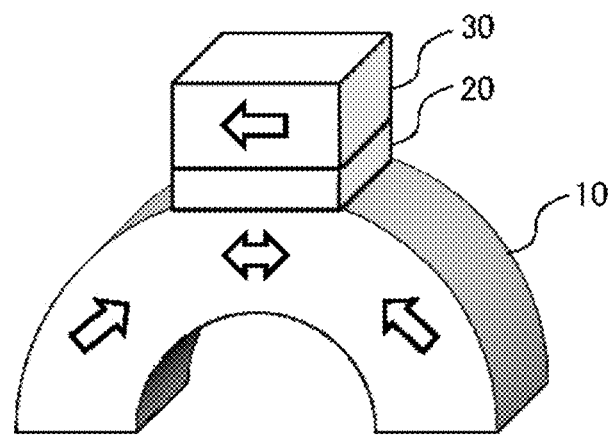

In the embodiments and modification examples described above, the recording layer 10 had a shape that extended in the lengthwise direction, but the shape of the recording layer 10 is not limited thereto. In the example shown in FIG. 15D, the recording layer 10 has an arch shape. By preparing the surface where the recording layer 10 is to be formed so as to have an arch shape in advance, the recording layer 10 can be formed in an arch shape. Alternatively, in the via making process, which is performed before the forming process of the recording layer 10, the recesses and protrusions may be left on the surface where the magnetic film is to be formed, thereby making possible the arch-shaped recording layer 10. By forming the recording layer 10 in an arch shape, it is possible to easily introduce the domain wall into the recording layer 10 by the external magnetic field having the substrate vertical component.

Modification Example 14

Figure 16A:
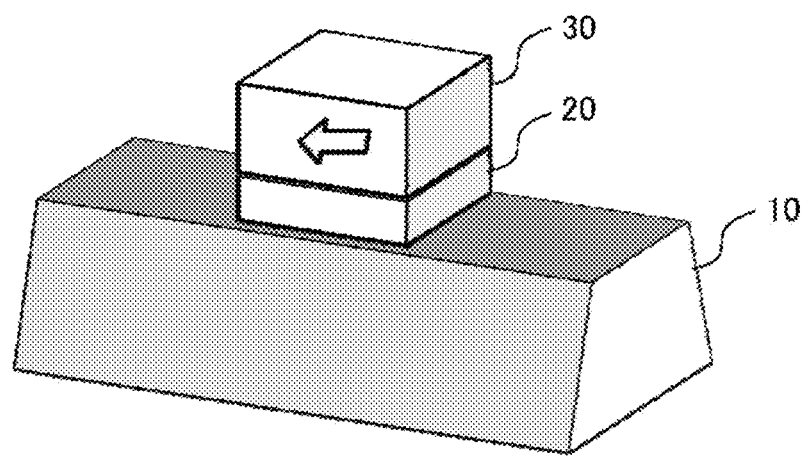
FIGS. 16A and 16B show the structure of a magnetoresistance effect element of Modification Example 14.

In the embodiments and modification examples described above, the Y-Z cross-section of the recording layer 10 was a square or rectangle, but the recording layer 10 may have a tapered shape. FIG. 16A shows an example of the shape of the magnetoresistance effect element 100 according to Modification Example 14. By making the recording layer 10 have a tapered shape, the domain wall can move smoothly and the threshold current density can further be reduced. The tapered shape can be realized by making adjustment in the patterning process of the recording layer 10 (adjustment of the incident ion beam angle, the shape of a hard mask, and the like).

Figure 16B:
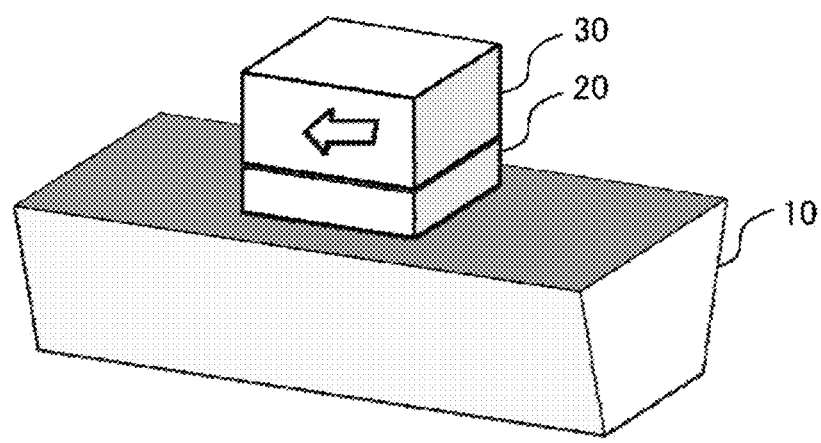

FIG. 16B shows another example in which the recording layer 10 has a tapered shape. In this example, the area of the surface that is closer to the substrate is smaller than the area of the surface on top (closer to the barrier layer 20). This shape can be realized by forming a recess in the film forming surface. For the film forming, a wet process such as physical vapor deposition or plating method can be performed.

Modification Example 15

In any of Modification Examples 2 to 14, the reference layer 30 may take the multi-layer ferrimagnetic structure described in Embodiment 2.

All of the embodiments described above are for STT-MRAM of the three-terminal (or four) type, but the technical concept of the present invention can also be applied to a race track memory that can be used for a large-capacity storage. That is, it is possible to provide a magnetic memory device that is made of a ferromagnetic body, having a track (recording layer) with a plurality of recording magnetic areas, and configured such that the track has the magnetization easy axis in the magnetic nanowire lengthwise direction, the wire width is 40 nm or less, and the film thickness thereof is at least half but no more than twofold the wire width.

The present invention may have various different embodiments and may be modified in various manners without departing from the broader spirit and scope of the present invention. The embodiments described above are intended to illustrate the present invention, and are not intended to limit the scope of the present invention. That is, the scope of the present invention is not specified by embodiments, but the appended claims. The various modifications implemented within the scope of the appended claims and the spirit and scope of the invention equivalent to the appended claims are considered within the scope of the present invention.

This application is based on Japanese Patent Application No. 2015-98976, filed on May 14, 2015, and is intended to incorporate the specification, claims, drawings and abstract thereof. What is disclosed in said Japanese Patent Application is entirely incorporated by reference herein.

What is claimed is:

1. A magnetoresistance effect element, comprising:
   a recording layer containing a ferromagnetic body, the recording layer including
      a first fixed magnetization region having a magnetization component fixed substantially in an in-plane direction,
      a second fixed magnetization region having a magnetization component fixed substantially in a direction antiparallel to the in-plane direction of the magnetization component of the first fixed magnetization region,
      a free magnetization region disposed between the first fixed magnetization region and the second fixed magnetization region, the free magnetization region having a magnetization component that is invertible in the in-plane direction,
      a domain wall disposed between the first fixed magnetization region and the free magnetization region, and being movable within the free magnetization region, and
      a magnetic nanowire having a width of 40 nm or less, the recording layer having a thickness of 40 nm or less, the thickness of the recording layer being at least half but no more than twofold the width of the magnetic nanowire;
   a barrier layer disposed on the recording layer; and
   a reference layer disposed on the barrier layer and containing a ferromagnetic body.

2. The magnetoresistance effect element according to claim 1, wherein
   the recording layer contains Ni and Fe,
   the width of the magnetic nanowire in the recording layer is 30 nm or less, and
   the thickness of the recording layer is 30 nm or less and at least two-thirds but no more than one and one half times the width of the magnetic nanowire.

3. The magnetoresistance effect element according to claim 1, wherein
   the recording layer has a first length in a first direction and a second length in a second direction that is perpendicular to the first direction provided that the first length is greater than the second length, and
   the magnetization component of the free magnetization region is inverted by applying an electrical current through the recording layer in the first direction.

4. The magnetoresistance effect element according to claim 1, wherein the domain wall is formed between the first fixed magnetization region and the free magnetization region or between the second fixed magnetization region and the free magnetization region, depending on direction of the magnetization component of the free magnetization region.

5. The magnetoresistance effect element according to claim 1, further comprising a magnetization fixing layer that fixes at least one of (a) direction of the magnetization component of the first fixed magnetization region and (b) direction of the magnetization component of the second fixed magnetization region.

6. The magnetoresistance effect element according to claim 1, wherein the recording layer includes a pinning site provided either between the first fixed magnetization region and the free magnetization region or between the second fixed magnetization region and the free magnetization region.

7. A magnetic memory device, comprising:
   the magnetoresistance effect element according to claim 1;
   a writing unit configured to write data into the magnetoresistance effect element by applying a writing current between the first fixed magnetization region and the second fixed magnetization region through the free magnetization region in the recording layer, to thereby move the domain wall; and
   a reading unit configured to read out data from the magnetoresistance effect element by applying a current through the barrier layer in a direction parallel to a thickness direction of the magnetoresistance element that is effective to obtain a tunnel resistance.

8. The magnetoresistance effect element according to claim 1, wherein the free magnetization region in the recording layer has a thickness of 40 nm or less, the thickness of the recording layer being at least half but no more than twofold the width of the magnetic nanowire.

* * * * *